(12) United States Patent
Schroeder et al.

(10) Patent No.: US 12,425,046 B2
(45) Date of Patent: Sep. 23, 2025

(54) EFFICIENT CHARACTER COUNTING FOR VARIABLE LENGTH ENCODING FORMATS

(71) Applicant: SAP SE, Walldorf (DE)

(72) Inventors: Marco Patrick Schroeder, Munich (DE); Suyeon Maeng, Seoul (KR); Sooyoung Kim, Seoul (KR); Kyungwook Ko, Seoul (KR)

(73) Assignee: SAP SE, Walldorf (DE)

( * ) Notice: Subject to any disclaimer, the term of this patent is extended or adjusted under 35 U.S.C. 154(b) by 203 days.

(21) Appl. No.: 18/242,984

(22) Filed: Sep. 6, 2023

(65) Prior Publication Data
US 2025/0080136 A1   Mar. 6, 2025

(51) Int. Cl.
*H03M 7/30* (2006.01)

(52) U.S. Cl.
CPC ......... *H03M 7/6011* (2013.01); *H03M 7/705* (2013.01)

(58) Field of Classification Search
CPC ............................ H03M 7/6011; H03M 7/705
USPC ........................................ 341/50, 51, 67, 87
See application file for complete search history.

(56) References Cited

U.S. PATENT DOCUMENTS

| | | | |
|---|---|---|---|
| 5,930,399 A | 7/1999 | Kadyk et al. | |
| 7,609,000 B1 * | 10/2009 | Sharma | H03M 7/40 341/59 |
| 7,965,207 B2 * | 6/2011 | Hendrickson | H03M 7/04 341/51 |
| 8,164,492 B2 | 4/2012 | Esbensen | |
| 2025/0077342 A1 | 3/2025 | Schroeder et al. | |

OTHER PUBLICATIONS

Non-Final OA issued in U.S. Appl. No. 18/242,981, Nov. 22, 2024, 16 pages.
Keiser et al., "Validating UTF-8 in less than one instruction per byte," Software: Practice and Experience 51.5 (2021), pp. 950-964 (2021).
Notice of Allowance received in U.S. Appl. No. 18/242,981, Apr. 1, 2025, 13 pages.

* cited by examiner

Primary Examiner — Khai M Nguyen
(74) Attorney, Agent, or Firm — Klarquist Sparkman, LLP

(57) ABSTRACT

Technologies and solutions are also provided for determining a number of characters in encoded data, particularly for encoding formats that have variable byte lengths. Bytes in the encoding format can have different types, including at least one type that represents a continuation byte. That is, rather than having all data for a character being in a single byte, the data is encoded using two or more bytes. The number of continuation bytes can be counted and subtracted from a total number of bytes in a data set to determine the number of characters in the data set. Optionally, the validity of the data set with respect to an encoding format can be determined prior to, or concurrently with, determining a number of characters in the data set. SIMD techniques can be used with the character counting/validation processes to improve their performance.

20 Claims, 19 Drawing Sheets

| Type of Byte | Notation | Bit Pattern |
|---|---|---|
| 1-byte code point (ASCII character) | C1 | 0\|xxx'xxxx |
| Leading byte of 2-byte code point | C2 | 110\|x'xxxx |
| Leading byte of 3-byte code point | C3 | 1110'xxxx |
| Continuation byte | C0 | 10\|xx'xxxx |
| Leading byte of leading/trailing surrogate | ED | 1110'xxxx |
| Second byte of leading surrogate | A | 10\|10'xxxx |
| Second byte of trailing surrogate | B | 10\|11'xxxx |

| Type of Code Point | Value Range | Notation | Bit Pattern |
|---|---|---|---|
| 1-byte code point (ASCII character) | U+0000 to U+007F | C1 | 0\|xxx'xxxx |
| 2-byte code point | U+0080 to U+07FF | C2-C0 | 110\|x'xxxx-10\|xx'xxxx |
| 3-byte code point | U+0800 to U+D7FF | C3-C0-C0 | 1110'xxxx-10\|xx'xxxx-10\|xx'xxxx |
| | U+E000 to U+FFFF | | |
| Leading surrogate | U+D800 to U+DBFF | ED-A-C0 | 1110'1101-10\|10'xxxx-10\|xx'xxxx |
| Trailing surrogate | U+DC00 to U+DFFF | ED-B-C0 | 1110'1101-10\|11'xxxx-10\|xx'xxxx |

| Type of Byte | Notation | Bit Pattern |
|---|---|---|
| 1-byte code point (ASCII character) | C1 | 0\|xxx'xxxx |
| Leading byte of 2-byte code point | C2 | 110\|x'xxxx |
| Leading byte of 3-byte code point | C3 | 1110'xxxx |
| Continuation byte | C0 | 10\|xx'xxxx |
| Leading byte of leading/trailing surrogate | ED | 1110'xxxx |
| Second byte of leading surrogate | A | 10\|10'xxxx |
| Second byte of trailing surrogate | B | 10\|11'xxxx |

100

| Type of Code Point | Value Range | Notation | Bit Pattern |
|---|---|---|---|
| 1-byte code point (ASCII character) | U+0000 to U+007F | C1 | 0\|xxx'xxxx |
| 2-byte code point | U+0080 to U+07FF | C2-C0 | 110\|x'xxxx-10\|xx'xxxx |
| 3-byte code point | U+0800 to U+D7FF | C3-C0-C0 | 1110\|'xxxx-10\|xx'xxxx-10\|xx'xxxx |
|  | U+E000 to U+FFFF |  |  |
| Leading surrogate | U+D800 to U+DBFF | ED-A-C0 | 1110'1101-10\|10'xxxx-10\|xx'xxxx |
| Trailing surrogate | U+DC00 to U+DFFF | ED-B-C0 | 1110'1101-10\|11'xxxx-10\|xx'xxxx |

Valid CESU-8 Three Byte Sequences:

|  | B1 | B2 | B3 |
|---|---|---|---|
| 204a | C0 | C01 | C123 |
| 204b | C0 | C23 | C0 |
| 204c | C1 | C1 | C123 |
| 204d | C1 | C23 | C0 |
| 204e | C2 | C0 | C123 |
| 204f | C3 | C0 | C0 |

200

C0: Continuation byte
C1: 1-byte ASCII code point
C2: 2-byte code point start
C3: 3-byte code point start Example: C23 → C2 OR C3

220

| Bit | 7 | 6 | 5 | 4 | 3 | 2 | 1 | 0 |
|---|---|---|---|---|---|---|---|---|
| Table 3 | C0 Count |  | C0 | C123 | C0 | C123 | C0 | C123 |
| Table 2 | A | B | C0 | C0 | C23 | C1 | C23 | C01 |
| Table 1 |  |  | C3 | C2 | C1 | C1 | C0 | C0 |

FIG. 2

| Error Condition | Pattern | Notation | Byte Pattern |
|---|---|---|---|
| Too Short | A1 | C2-C1 | 110\|x'xxxx – 0\|xx'xxxx |
| | A2 | C2-C2 | 110\|x'xxxx – 110\|x'xxxx |
| | A3 | C2-C3 | 110\|x'xxxx – 1110\|x'xxxx |
| | A4 | C3-C1 | 1110\|x'xxxx – 0\|xxx'xxxx |
| | A5 | C3-C2 | 1110\|x'xxxx – 110\|x'xxxx |
| | A6 | C3-C3 | 1110\|x'xxxx – 1110\|x'xxxx |
| | A7 | C3-C0-C1 | 1110\|x'xxxx – 10\|xx'xxxx – 0\|xxx'xxxx |
| | A8 | C3-C0-C2 | 1110\|x'xxxx – 10\|xx'xxxx – 1110\|xxxx |
| | A9 | C3-C0-C3 | 1110\|x'xxxx – 10\|xx'xxxx – 1110\|x'xxxx |
| Too Long | B1 | C1-C0 | 0\|xxx'xxxx – 10\|xx'xxxx |
| | B2 | C2-C0-C0 | 110\|x'xxxx – 10\|xx'xxxx – 10\|xx'xxxx |
| | B3 | C0-C0-C0 | 10\|xx'xxxx – 10\|xx'xxxx – 10\|xx'xxxx |
| Overlong | D1 | C2-0₁₆ | 110\|0'0000 |
| | D2 | C2-1₁₆ | 110\|0'0001 |
| | D3 | E0₁₆-8₁₆ | 1110\|'0000 – 10\|00'xxxx |
| | D4 | E0₁₆-9₁₆ | 1110\|'0000 – 10\|01'xxxx |

FIG. 4

| Bit | Table 1 (High) | Table 1 (Low) | Table 2 | Table 3 | Combined Result | Meaning |
|---|---|---|---|---|---|---|
| 0 | all | all | C2/C3 | C1/C2/C3 | C2/C3-C1/C2/C3 | Too short (2/3-byte code point) |
| 1 | C3 | all | C0 | C1/C2/C3 | C3-C0-C1/C2/C3 | Too short (3-byte code point) |
| 2 | all | all | C1 | C0 | C1-C0 | Too long (1-byte code point) |
| 3 | C0/C2 | all | C0 | all | C0/C2-C0-C0 | Too long (2/3-byte code point) |
| 4 | C₁₆ | 0₁₆/1₁₆ | all | all | C0₁₆/C1₁₆ | Overlong 2-byte code point |
| 5 | E₁₆ | 0₁₆ | 8₁₆/9₁₆ | none | E0-8/E0-9 | Overlong 3-byte code point |
| 6 | E₁₆ | D₁₆ | B₁₆ | none | ED-B | Trailing Surrogate |
| 7 | E₁₆ | D₁₆ | A₁₆ | none | ED-A | Leading Surrogate |

Lookup T2

| Index Binary | Index Hex | Value Binary | Value Hex | Pattern Match | Pattern Match Meaning |
|---|---|---|---|---|---|
| 0000 | 0 | 0001'0100 | 0x14 | 0xxx'xxxx | C1 |
| 0001 | 1 | 0001'0100 | 0x14 | 0xxx'xxxx | C1 |
| 0010 | 2 | 0001'0100 | 0x14 | 0xxx'xxxx | C1 |
| 0011 | 3 | 0001'0100 | 0x14 | 0xxx'xxxx | C1 |
| 0100 | 4 | 0001'0100 | 0x14 | 0xxx'xxxx | C1 |
| 0101 | 5 | 0001'0100 | 0x14 | 0xxx'xxxx | C1 |
| 0110 | 6 | 0001'0100 | 0x14 | 0xxx'xxxx | C1 |
| 0111 | 7 | 0001'0100 | 0x14 | 0xxx'xxxx | C1 |
| 1000 | 8 | 0011'1010 | 0x3A | 1xxx'xxxx | C0 |
| 1001 | 9 | 0011'1010 | 0x3A | 1xxx'xxxx | C0 |
| 1010 | A | 1001'1010 | 0x9A | 1xxx'xxxx | C0 |
| 1011 | B | 0101'1010 | 0x5A | 1xxx'xxxx | C0 |
| 1100 | C | 0001'0001 | 0x11 | 110x'xxxx | C2 |
| 1101 | D | 0001'0001 | 0x11 | 110x'xxxx | C2 |
| 1110 | E | 0001'0001 | 0x11 | 1110'xxxx | C3 |
| 1111 | F | 0000'0000 | 0x0 | 1111'xxxx | CX |

Lookup T3

| Index Binary | Index Hex | Value Binary | Value Hex | Pattern Match | Pattern Match Meaning |
|---|---|---|---|---|---|
| 0000 | 0 | 0011'0011 | 0x33 | 0xxx'xxxx | C1 |
| 0001 | 1 | 0011'0011 | 0x33 | 0xxx'xxxx | C1 |
| 0010 | 2 | 0011'0011 | 0x33 | 0xxx'xxxx | C1 |
| 0011 | 3 | 0011'0011 | 0x33 | 0xxx'xxxx | C1 |
| 0100 | 4 | 0011'0011 | 0x33 | 0xxx'xxxx | C1 |
| 0101 | 5 | 0011'0011 | 0x33 | 0xxx'xxxx | C1 |
| 0110 | 6 | 0011'0011 | 0x33 | 0xxx'xxxx | C1 |
| 0111 | 7 | 0011'0011 | 0x33 | 0xxx'xxxx | C1 |
| 1000 | 8 | 0011'1100 | 0x3C | 10xx'xxxx | C0 |
| 1001 | 9 | 0011'1100 | 0x3C | 10xx'xxxx | C0 |
| 1010 | A | 0011'1100 | 0x3C | 10xx'xxxx | C0 |
| 1011 | B | 0011'1100 | 0x3C | 10xx'xxxx | C0 |
| 1100 | C | 0011'0011 | 0x33 | 110x'xxxx | C2 |
| 1101 | D | 0011'0011 | 0x33 | 110x'xxxx | C2 |
| 1110 | E | 0011'0011 | 0x33 | 1110'xxxx | C3 |
| 1111 | F | 0000'0000 | 0x0 | 1111'xxxx | CX |

FIG. 5B

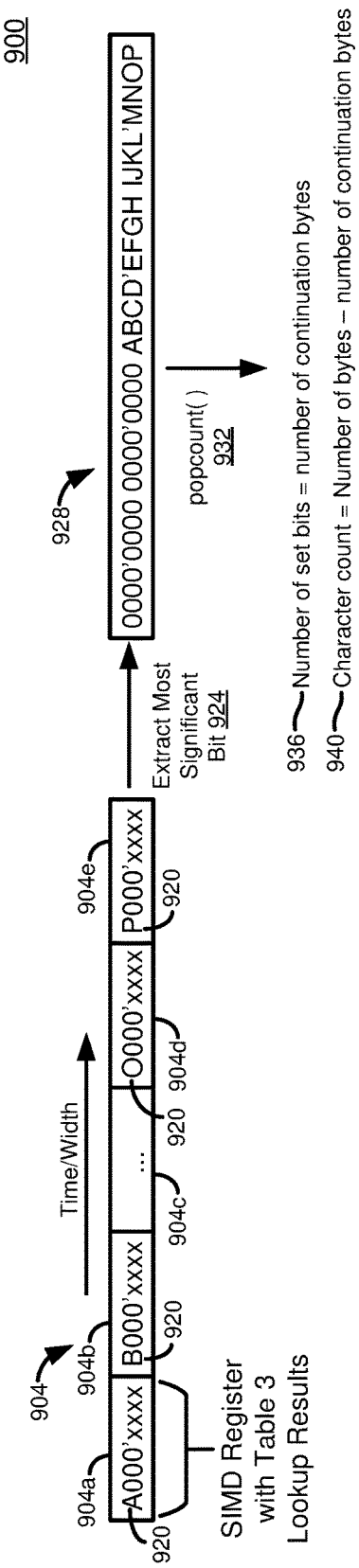
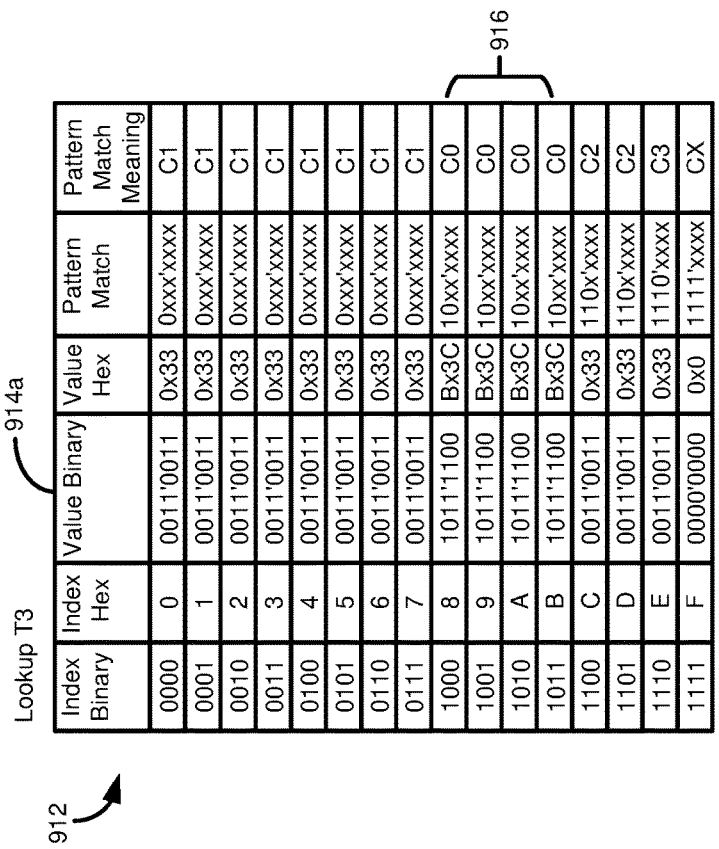
FIG. 9

```
Input: byte array str of length len
prev_bytes ← 0
has_error ← 0
prev_leading_surrogates ← 0
while len >= N do
    // Load next bytes
    bytes3 ← load next N bytes from str
    bytes2 ← bytes3 shifted right by 1-byte inserting from prev_bytes
    bytes1 ← bytes3 shifted right by 2-byte inserting from prev_bytes
    // Extract nibbles
    nibbles3 ← (bytes3 >>4) & 0x0F
    nibbles2 ← (bytes2 >>4) & 0x0F
    nibbles1_low ← bytes3 & 0x0F
    nibbles1_high ← (bytes3>>) & 0x0F
    // Table lookup
    result3 ← table3[nibbles3]
    result2 ← table2[nibbles2]
    result1_low ← table1_low[nibbles1_low]
    result1_high ← table1_high[nibbles1_high]
    temp ← result2 & result1_low & result1_high
    // Detect error conditions A) Too short, B) Too long, D) Overlong
    error_flags_abd ← temp & result3
    // Detect error condition E) Invalid surrogate
    leading_surrogates ← temp & 0x80
    trailing_surrogates ← (temp & 0x40) << 1
    leading_surrogates_shifted ← leading_surrogates shifted right by 3-byte inserting from prev_leading_surrogates
    error_flags_e ← leading_surrogates_shifted ^ trailing_surrogates
    // Detect error condition C) Illegal header
    error_flags_c ← (nibbles3 == 0x0F)
    // Store result and setup next iteration
    has_error ← has_error | error_flags_abd | error_flags_c | error_flags_e
    prev_bytes ← bytes3
    prev_leading_surrogates ← leading_surrogates
end
```

FIG. 10

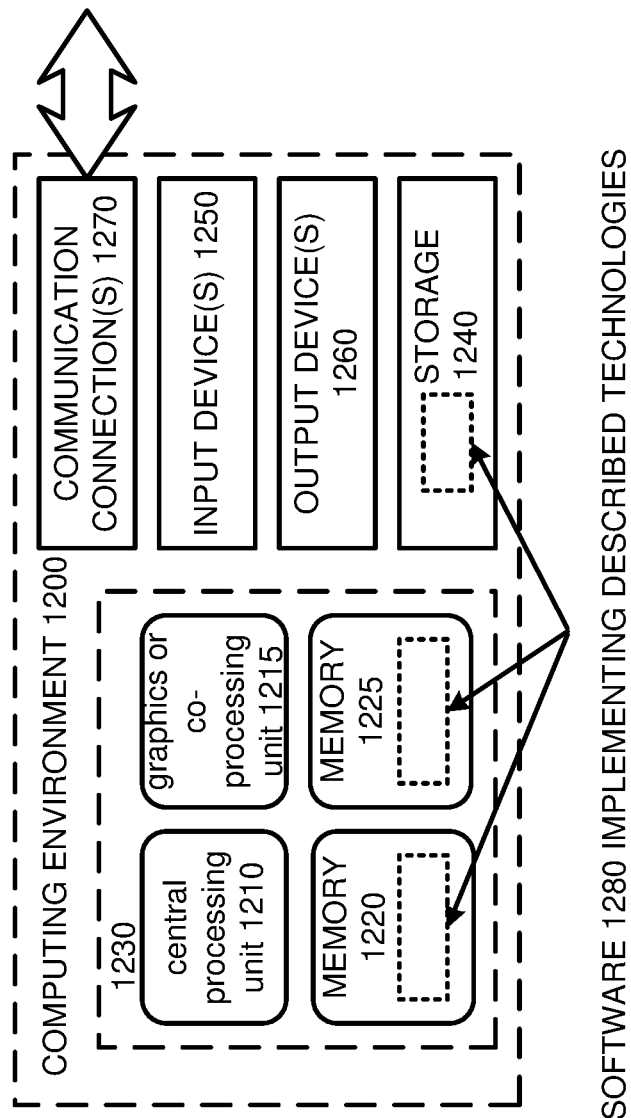

EFFICIENT CHARACTER COUNTING FOR VARIABLE LENGTH ENCODING FORMATS

FIELD

The present disclosure generally relates to counting characters in a data set encoded in a variable-length format.

BACKGROUND

Given all of the functionality provided by software applications, and the comparative ease of programming applications using high level programming languages, it is easy, even for those in the field of computer science, to overlook the complexity of even basic software processes. For example, receiving, inputting, and processing textual input involves encoding characters according to a particular format, where the characters are eventually represented as a collection of ones and zeros. Some encoding schemes represent characters as a collection of one or more bytes.

Different encoding schemes can support the encoding of different numbers of characters. For example, characters encodable using the ASCII format have been supplemented with Unicode encoding, such as UTF-8 and UTF-16, that allow for ASCII characters to be represented, in addition to characters that are not supported by ASCII. These additional characters can include non-language symbols or characters in non-Latin alphabets (or "character sets"). Other encoding schemes can be used to encode characters, including the Unicode character set, such as CESU-8. A choice of what encoding format to use can depend on considerations such as compatibility with other encoding formats, storage compactness, whether fixed-length encoding may be beneficial, or the extent to which "supplementary characters" may be used. The CESU-8 encoding format can be useful in providing compatibility with UTF-16, while also remaining compatible with ASCII.

In some cases, it can be "safe" to assume that data that represents textual content has been encoded properly, such as if all processing occurs on the same computing system. However, in some cases, it may be desirable to determine whether data has been encoded correctly, such as when data is received from another computing system, and errors might be present in the original data, or might have been introduced during transmission. Checking the validity of data can help avoid errors that might result from processing improperly encoded data, or incurring processing costs on data that turns out to have encoding errors. However, determining the validity of encoded data can be time consuming and resource intensive.

Another issue that can arise in character encoding is determining a number of characters in data encoded in a variable-length format, such as CESU-8. That is, while in some encoding formats, such as ASCII, a number of bytes (one, in the case of ASCII) is exactly equal to the number of characters in a data set (assuming validly encoded data), a number of bytes in variable-length formats is not equal to the number of characters, since different characters are represented using differing numbers of bytes. For example, CESU-8 can represent characters using one, two, three, or six bytes. In some cases, it can be difficult to determine a number of characters in a data set without fully decoding the data set. Accordingly, room for improvement exists.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Techniques and solutions are provided for determining the validity of encoded data. Data encoding techniques associated with a particular format can encode characters as a sequence of bytes, where the bytes can be of particular types. Particular sequences of byte types can be valid or invalid using a given encoding format. Lookup tables can be defined to examine bytes in a byte sequence to determine whether the sequence is valid or invalid. In a particular example, results of lookup operations can produce a result in the form of a sequence of bits, where values of the bits can be used to identify that a sequence is invalid, as well a particular type of encoding error. The techniques can be implemented in ways that are particularly efficient for a computing system, such as implementing lookup operations using SIMD ("Single Instruction, Multiple Data") techniques.

Technologies and solutions are also provided for determining a number of characters in encoded data, particularly for encoding formats that have variable byte lengths. Bytes in the encoding format can have different types, including at least one type that represents a continuation byte. That is, rather than having all data for a character being in a single byte, the data is encoded using two or more bytes. The number of continuation bytes can be counted and subtracted from a total number of bytes in a data set to determine the number of characters in the data set. Optionally, the validity of the data set with respect to an encoding format can be determined prior to, or concurrently with, determining a number of characters in the data set. SIMD techniques can be used with the character counting/validation processes to improve their performance.

In one aspect, the present disclosure provides a process of validating encoded data. An input data set including a plurality of bytes is received. A first subset of the plurality of bytes is analyzed. The first subset is selected according to a defined length and includes multiple bytes of the plurality of bytes. For a first byte of the multiple bytes of the first subset, information in the first byte is used to perform a lookup using a first lookup table to provide a first byte result for the first subset. For a second byte of the multiple bytes of the first subset, information in the second byte is used to perform a lookup using a second lookup table to provide a second byte result for the first subset. The second lookup table can be the first lookup table or can be another lookup table. For a third byte of the multiple bytes of the first subset, information in the third byte is used to perform a lookup using a third lookup table to provide a third byte result for the first subset. The third lookup table can be the first lookup table or the second lookup table, or can be another lookup table. The first byte result, the second byte result, and the third byte result for the first subset are combined to provide a first combined result. It is determined from the first combined result whether the first subset is validly encoded.

In another aspect, the present disclosure provides a process of determining a number of characters present in encoded data. A data set is received that is encoded in a variable byte length format. The variable byte length format includes one or more sequence types including a plurality of bytes. At least a first sequence type of the one or more sequence types includes a leading byte and one or more continuation bytes. A number of continuation bytes in the data set is identified. The number of continuation bytes in the data set is subtracted from a number of bytes in the data set to provide a number of characters present in the data set.

The present disclosure also includes computing systems and tangible, non-transitory computer readable storage media configured to carry out, or including instructions for carrying out, an above-described method. As described herein, a variety of other features and advantages can be incorporated into the technologies as desired.

BRIEF DESCRIPTION OF THE DRAWINGS

FIG. 1 illustrates a notation used with CESU-8 encoded data in the present disclosure, both for individual bytes of data and for various valid byte sequences for CESU-8.

FIG. 2 illustrates how valid byte patterns in CESU-8 can be represented using 6 bits, and how the highest two bits of a byte can be used for other analysis purposes, such as for character counting or for tracking whether a given byte sequence corresponds to a leading or trailing surrogate in a CESU-8 surrogate pair.

FIG. 4 illustrates various encoding errors that can be present in CESU-8 encoded data, and how those errors can be represented in a byte, where the bits of the byte serve as flag bits identifying a particular type of validation error, and where the two-highest bits can be used to track additional information, such as whether a given byte sequence corresponds to a leading or trailing surrogate of a surrogate pair.

FIGS. 5A and 5B illustrate examples of lookup tables that can be used in analyzing CESU-8 encoded data to determine a result byte that can be used to identify a validation error, or provide other information, such as using the bit flag interpretation presented in FIG. 4.

FIG. 6B also illustrates how the bit flags for leading or trailing surrogates can be used to identify whether consecutive three-byte sequences that include a surrogate are part of a properly encoded surrogate pair.

FIG. 9 illustrates a process of determining a number of characters in data encoded in a variable-length format, such as CESU-8, using a disclosed technique.

FIG. 10 illustrates example pseudocode for an encoding validation process according to the present disclosure.

FIG. 12 is a diagram of an example computing system in which some described embodiments can be implemented.

DETAILED DESCRIPTION

Example 1—Overview

Figure 3A:
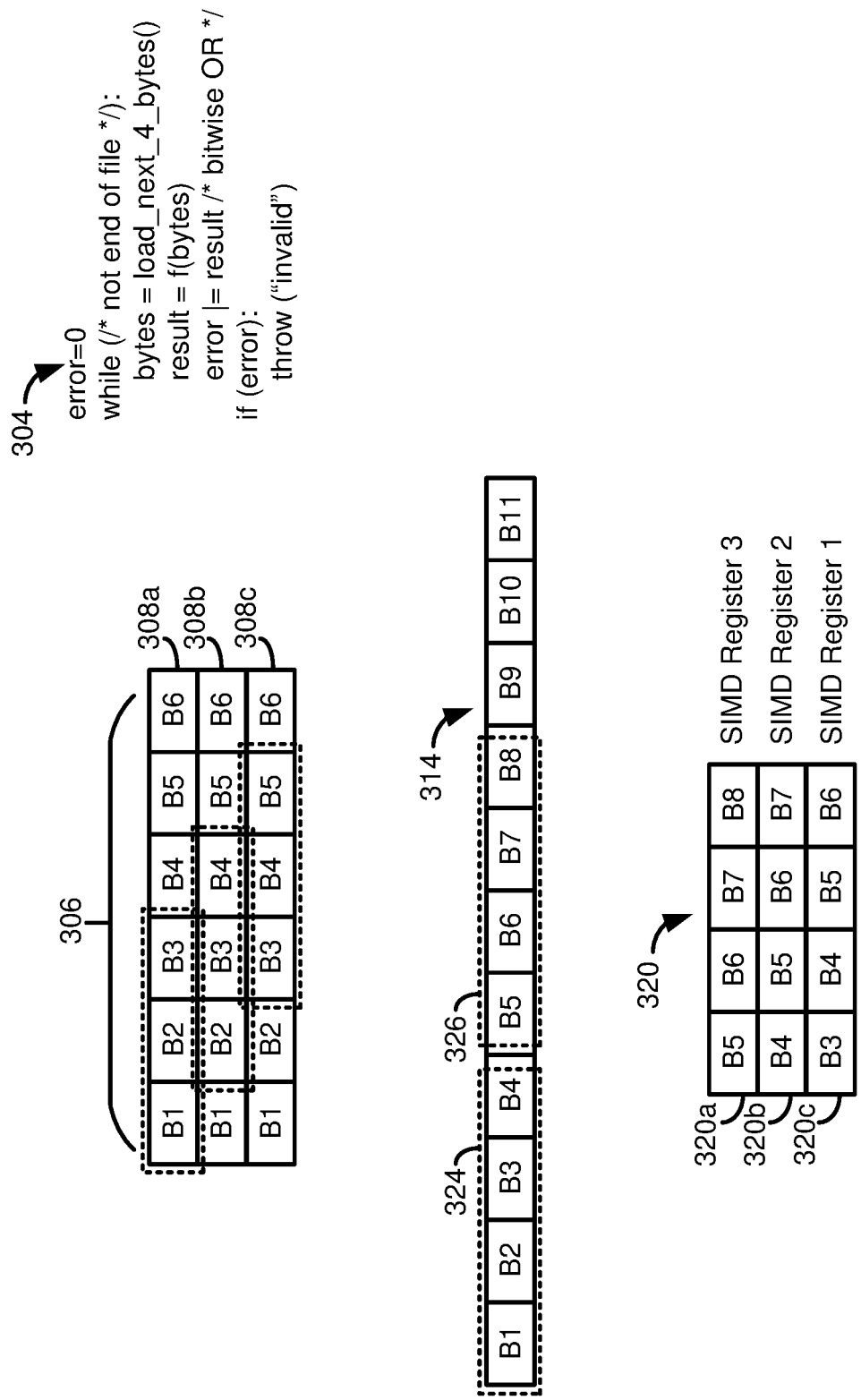
FIG. 3A illustrates a process for analyzing encoded data using disclosed techniques, where multiple, sequential three-byte sequences can be loaded into SIMD registers for validation.

Given all of the functionality provided by software applications, and the comparative ease of programming applications using high level programming languages, it is easy, even for those in the field of computer science, to overlook the complexity of even basic software processes. For example, receiving, inputting, and processing textual input involves encoding characters according to a particular format, where the characters are eventually represented as a collection of ones and zeros. Some encoding schemes represent characters as a collection of one or more bytes.

Different encoding schemes can support the encoding of different numbers of characters. For example, characters encodable using the ASCII format have been supplemented with Unicode encoding, such as UTF-8 and UTF-16, that allow for ASCII characters to be represented, in addition to characters that are not supported by ASCII. These additional characters can include non-language symbols or characters in non-Latin alphabets (or "character sets"). Other encoding schemes can be used to encode characters, including the Unicode character set, such as CESU-8. A choice of what encoding format to use can depend on considerations such as compatibility with other encoding formats, storage compactness, whether fixed-length encoding may be beneficial, or the extent to which "supplementary characters" may be used. The CESU-8 encoding format can be useful in providing compatibility with UTF-16, while also remaining compatible with ASCII.

In some cases, it can be "safe" to assume that data that represents textual content has been encoded properly, such as if all processing occurs on the same computing system. However, in some cases, it may be desirable to determine whether data has been encoded correctly, such as when data is received from another computing system, and errors might be present in the original data, or might have been introduced during transmission. Checking the validity of data can help avoid errors that might result from processing improperly encoded data, or incurring processing costs on data that turns out to have encoding errors. However, determining the validity of encoded data can be time consuming and resource intensive.

Another issue that can arise in character encoding is determining a number of characters in data encoded in a variable-length format, such as CESU-8. That is, while in some encoding formats, such as ASCII, a number of bytes (one, in the case of ASCII) is exactly equal to the number of characters in a data set (assuming validly encoded data), a number of bytes in variable-length formats is not equal to the number of characters, since different characters are represented using differing numbers of bytes. For example, CESU-8 can represent characters using one, two, three, or six bytes. In some cases, it can be difficult to determine a number of characters in a data set without fully decoding the data set. Accordingly, room for improvement exists.

Certain encoding schemes, such as CESU-8, include header bits indicating what type of information a particular byte sequence is intended to represent, or what an individual byte within a byte sequence represents. For example, and as will be further explained, header bits can be used to indicate whether a byte is a one-byte encoded character, a two-byte encoded character, a three-byte encoded character, or a three-byte encoded surrogate of a surrogate pair, where the character is encoded using a six-byte sequence that includes the two three-byte sequences of the surrogates in the surrogate pair. Typically, the validity of CESU-8 encoded string is carried out using logic, such as in the loop below:

```
while (/* not end of file */):
    byte b=read_next_byte ( )
    if is_1 byte_header (b): { ... }
    if is_2 byte_header (b): { ... }
    if is_3 byte_header (b): { ... }
    throw "invalid"
```

As can be seen, this logic processes every byte of input, and thus has O(n) complexity. Further, separate processes are used for each type of byte heading, which can be inefficient.

Certain prior work describes analyzing particular bit patterns to determine whether one or two-byte sequences have been properly encoded in UTF-8, such as described in Lemire, et al., "Validating UTF-8 In Less than One Instruction Per Byte," arXiv: 2010.03090v4 (hereinafter, "Lemire"). Lemire describes determining error conditions by using bytes in a two-byte sequence with lookup tables to determine whether the input matches an error condition. However, the technique in Lemire is unable to detect errors in three or four-byte UTF-8 sequences without extra processing. Further, the Lemire technique is specific to UTF-8, and does not describe issues that can arise with "surrogate pairs" that can occur in encoding schemes such as CESU-8 and UTF-16.

The present disclosure provides techniques that can be used to more efficiently determine whether a data stream representing encoded text is valid. The technique can handle byte-streams of more than two bytes using a single SIMD operation, which can be more efficient than techniques such as Lemire, which require additional processing. In addition, the technique allows surrogate pairs for to be checked for validity, such as by determining whether a leading surrogate is followed by a trailing surrogate, or whether a trailing surrogate is preceded by a leading surrogate.

The present disclosure provides additional advantages. For example, an issue that can arise when variable-length encoded formats are used is that it can be difficult to determine a number of characters in a particular set of input, because the number of bytes in the input is not equal to the number of characters in the input. This can be compared with a format such as ASCII, where all characters are encoded using a single byte, so that the number of characters is equal to the number of bytes. A technique is described where a number of continuation bytes can be determined, either as a separate process or as part of the above-described validation process. The number of continuation bytes can be subtracted from the number of bytes in an input stream to provide the number of characters in the input stream.

Example 2—Example Notation for CESU-8 Encoded Data

In character encoding schemes, particular characters are associated with corresponding, particular "code points." A code refers to a value, such as a numerical value, that represents a specific character. The present disclosure proceeds with a discussion of how disclosed techniques can be used with the CESU-8 encoding format. However, it should be appreciated that disclosed techniques can be employed in other character encoding schemes, or in encoding schemes more generally.

In the example of CESU-8, code points can be represented in one, two, three, or six-byte sequences. Typically, for efficiency, characters that are expected to be more commonly used are encoded using shorter-length sequences. In CESU-8, one-byte sequences are used to represent ASCII characters. Given that one-byte CESU-8 sequences directly correspond to an ASCII character, CESU-8 can be considered as backward compatible with ASCII. CESU-8 is also compatible with UTF-8 for characters in the "Basic Multilingual Plane" (BMP, U+0000 to U+FFFF). CESU-8 also has some compatibility with UTF-16, for characters outside the BMP, where UTF-16 surrogate pairs are represented in CESU-8 as two, three-byte UTF-8 sequences.

In CESU-8, two and three-byte sequences are used to cover the BMP, while six-byte surrogate pairs are used for encoding "astral" or "supplementary" characters outside of the BMP. A two-byte code point is encoded using a leading byte for the two-byte code point and a continuation byte, while a three-byte code point is encoded using a leading byte for the three-byte code point and two continuation bytes. A six-byte surrogate pair is formed from two three-byte sequences. The two three-byte sequences include a sequence identifying a sequence as a surrogate, a second byte that has header information indicating whether it is the second byte for a leading or trailing surrogate, and a continuation byte.

In FIG. 1, table 100 illustrates various types of bytes that can be represented in CESU-8 in column 104a, column 104b provides a notation for this type of byte that is used in the present disclosure, and column 104c provides representative bit patterns for each byte type. In column 104c, numerical values serve has header information that can be used to identify a byte type of column 104a. Values of "x" represent data that can change based on a particular character being encoded. For example, for two and three-byte sequences, a bit pattern of "10" for the most two most-significant (also referred to as the "leading bits," where the most significant bit is the leftmost bit) indicates that the byte is a continuation byte of a multi-byte sequence.

Table 150 of FIG. 1 includes a column 154a for various types of code points, including all bytes for the code point, where column 154b provides value ranges for characters within a given code point type, column 154c provides a notation for the byte sequence for the given code point type used in the present disclosure, and column 154d provides an overall bit pattern that would be excepted for validly encoded characters. Taking the example of a three-byte code sequence, it can be seen that the row 158a includes header bits having a value of "1110," which according to the table 100 indicates the leading byte of a three-byte code sequence, including such code sequences that serve as leading or trailing surrogates of a surrogate pair. The header bits of the next two bytes in the sequence are "10," indicating that both of these bytes are continuation bytes (and not of a surrogate). Continuation bytes of a two or three-byte code sequence can be distinguished from continuation bytes for leading or trailing surrogates based on values for the third and fourth most significant bits of the second byte in a three-byte sequence, where "10" identifies a leading surrogate and "11" identifies a trailing surrogate.

Reviewing tables 100 and 150, it can be seen how encoding errors can be detected. For example, if a two-byte sequence is indicated by header bits "110" a subsequent byte would be expected to be a continuation byte, having header bits of "10." If the byte following a byte with "110" header bits does not have "10" as its header bits, an error can be identified.

Example 3—Example Data Validation

The present disclosure provides techniques that can be used to efficiently identify various encoding errors, or to provide other information about byte sequences in an input data stream. Generally, these techniques involve the use of particular lookup tables. A set of bits from encoded data being analyzed can be used as an index to an appropriate lookup table. A bit pattern is provided as a result of a table lookup. Values from different lookup tables, corresponding to results from using different lookup tables for a larger set of encoded data, can then be combined. The resulting bit patterns can be used to identify whether an encoding error exists and, if so, at least in some cases, the type of error.

FIG. 2 includes a table 200 illustrating various possible valid CESU-8 byte combinations that can be achieved for a three-byte sequence for an encoded character. The table 200 includes a total of six entries, but is a consolidated representation of seventeen possible three-byte sequences that are considered valid. Consolidation of the seventeen combinations to six combinations allows valid patterns to be specified using six bits of a byte. The remaining bits can be used for other purposes, at least in some implementations, such as to identify leading or trailing surrogates, or for use in tracking continuation bytes. As will be further discussed, tracking continuation bytes can be used to provide a disclosed character counting technique. In particular, tracking the number of continuations bytes, given the notation "C0," allows a number of characters in a byte stream to be determined by subtracting the number of continuation bytes from a total number of bytes in the byte stream.

Consider various rows 204a-204f of the table 200, and columns 208a-208c, where the rows indicate a particular three-byte pattern, and the columns indicate a particular byte type. In table 200, the presences of multiple integers in a given column 208 is to be read as "or." So, for example, row 204a, column 208b, of the table means that particular cell can have a value of C0 or C1. Similarly, the cell at row 204a, column 208c, can have values of C1, C2, or C3. Expanding the various possible patterns for row 204a provides patterns of:

C0-C0-C1
C0-C0-C2
C0-C0-C3
C0-C1-C1
C0-C1-C2
C0-C1-C3

The first three sequences are all valid, or at least potentially valid, since a three-byte sequence would have two continuation bytes (C0) and then could be followed by a 1-byte character (C1), the first byte of a 2-byte character (C2), or the first byte of a 3-byte character (C3). Note that checking bytes before or after a given three-byte sequence may also need to be checked to determine whether the overall byte stream is valid. For example, a value of "C0" for row 204a, column 208a, is potentially valid, but assumes that the first byte in the code sequence being analyzed is not immediately preceded by a C1 byte, and is preceded by a C2 or C3 byte, and optionally an addition C0 byte, in the case of a three-byte sequence. The analysis of rows 204a-208c is similar.

FIG. 2 also presents a table 220, which can be considered an alternative representation of the table 200, where the table 220 also includes information in columns 228a and 228b for bits 7 and 8 in a byte that reflects valid byte-sequences. In table 220, bits 0-5, columns 228c-228h, correspond to the rows 204a-204f of the table 200, and indicate valid byte sequences. Rows 224a-224c of the table 220 correspond to values that are in three lookup tables for a three-byte sequence, where Table 1 of row 224a is used for the leading byte, Table 2 of row 224b is used for the second byte, and Table 3 of row 224c is used for the third, or trailing, byte of the three-byte sequence.

In this implementation, the high (or leading) nibble (four bits) of a byte are used as input for a corresponding lookup table to provide a result. The result is non-zero for valid sequences. The results of all three lookup tables/bytes can be combined using a bitwise AND operation. If the results of the AND operation for all bits is non-zero, then the sequence is valid. If any bits have a zero result, the sequence is invalid. Saturated subtraction can be used with this result (subtracting the result from a series of "1" values for each bit position) to convert the result to a format where a valid sequence is indicated by all zero values, and the presence of a "1" for any bit indicates an error.

FIGS. 3A-3D illustrate an example process according to the present disclosure for determining character encoding errors, such as in CESU-8. In this particular example process, consecutive three-byte sequences in the input stream are analyzed for validity, such as according to the algorithm 304 of FIG. 3A. FIG. 3A illustrates how a six-byte sequence 306, having bytes B1-B6, can be analyzed using consecutive three-byte sequences. In a first iteration 308a, the first three bytes, B1-B3 are analyzed. In a next iteration 308b, the starting byte is shifted by one, and so bytes B2-B4 are analyzed. In the third iteration 308c, the starting byte is again shifted by one, and bytes B3-B5 are analyzed. As discussed above, error conditions for CESU-8 can be determined by looking at three-byte sequences, which is why the input stream is analyzed in three-byte segments.

FIGS. 3A-3D also illustrates how the analysis process can be implemented efficiently using SIMD (Single Instruction, Multiple Data) instructions. In this example, the SIMD register size is assumed to be four-bytes. However, disclosed techniques can be adapted to use larger (typically) or smaller register sizes. As shown in pseudocode of the algorithm 304, four-byte segments of an input are progressively analyzed, such as with respect to an input stream 314, which shows the four-byte sequences involved in a first iteration 324 of the algorithm and a second iteration 326 of the algorithm.

The input stream 314 can be processed so that three SIMD registers 320 (shown as 320a, 320b, 320c), each being 4-bytes wide, include respective bytes of a three-byte sequence. Assuming a validation process begins at byte five (B5) of the input sequence, each "lane" of the three registers is filled with the contents of the byte at the current position and the preceding two bytes. It can be seen that the contents of the registers 320 thus correspond to four-byte sequences, where the register 320a for the third byte in the three-byte sequence starts at the beginning position B5 and continue for four bytes, filling up the register 320a, and where the contents of the registers 320b, 320c, representing the second and first bytes of the three-byte sequence, are progressively shifted lower by one byte.

Figure 3B:
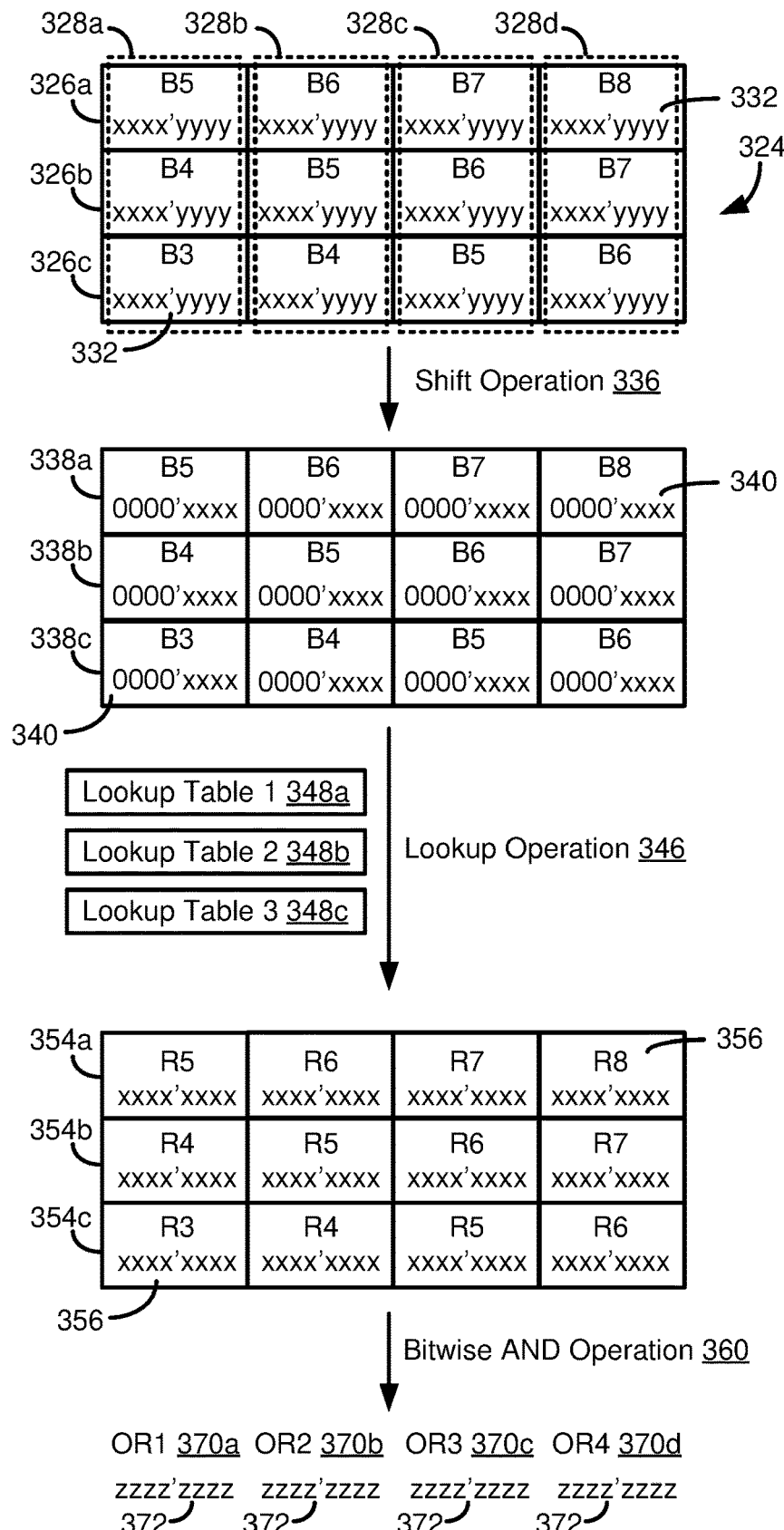
FIG. 3B illustrates how the three-byte sequences in the SIMD registers of FIG. 3A can be processed by extracting the high-nibbles of the relevant bytes, using lookup operations to obtain a result for each byte, and then determining a combined result for each three-byte sequence using a bitwise AND operation, where the combined results indicate whether a given three-byte sequence is validly encoded.

FIG. 3B provides details of how the bytes in the SIMD registers 320 can be processed. A representation 324 of SIMD registers 326 (shown as SIMD registers 326a-326c) generally corresponds to the SIMD registers 320 of FIG. 3A.

However, in this case, each lane (also referred to as a vector element) 328 (shown as 328a-328d) of the SIMD registers 326 is shown as including a bit representation 332 of a particular byte stored in a given lane.

The bit representations 332 are "generic" in that the high nibble of each byte is represented by "x" elements, and the low nibble of each byte is represented by "y" elements. Both "x" and "y" are selected from 0 and 1, and are selected independently at each bit position. That is, for example, if one occurrence of "x" is "1," another occurrence of "x" in the same bit representation could be "1," but could also be "0." The use of "x" and "y" values for the high and low nibbles, respectively, is intended to clarify which bit positions are part of the high nibble and which are part of the low nibble, for purposes of further explaining the use of the SIMD registers 326.

According to the process, the high nibble of the bit representations 332 are obtained by performing a shift operation 336. The results of the shift operation 336 are shown in registers 338 (shown as 338a-338d). It can be seen the bit representations 340 in registers 338 have the high nibble contents of the registers 326 as the low nibble, and the high nibble is padded with "0" values. Depending on implementation, such as the number of available registers, or the operations supported by registers, the registers 338 can be the same as registers 326, or can be different registers.

The bit representations 340 are used in a lookup operation 346, where the bit representations are used as an index to respective lookup tables 348 (shown as 348a-348c). Three lookup tables 348 are shown, corresponding to each register 338, where, as described, each register corresponds to a particular byte in a three-byte sequence. However, different numbers of lookup tables can be used, such depending on the length of a byte sequence being analyzed (such as whether three-byte sequences are being analyzed, such as in a described implementation of CESU-8 validation, or whether short or longer sequences may be used for validating characters encoded in other schemes), or based on particular implementation details for a particular sequence byte length. For example, the currently described process analyzes only the high nibble of each byte representation 340, while other techniques can also analyze the low nibble of one or more register lanes. In particular, another implementation of CESU-8 validation that will be described uses tables for both the high and low nibbles of the first byte in a three-byte sequence, while only the high nibbles of the second and third bytes in the sequence are analyzed.

Results 356 are obtained for the lookup operation 346 and stored in SIMD registers 354 (shown as 354a-354c). In a particular implementation, each lookup result 356 is a bit pattern that identifies whether an error has been identified in a particular byte of a byte sequence represented by aligned lanes 328 of the SIMD registers 326. For example, a result 356 can have a bit pattern of "1111'1111" if no errors are identified, and a "0" in any position indicates an error. In another implementation, a result 356 can have a bit pattern of "0000'0000" if no errors are identified, and a "1" in any position indicates an error.

In either case, a bitwise AND operation 360 can be performed within a set of aligned lanes of the SIMD registers 354, representing a specific three-byte sequence, to obtain an overall result 370 (shown as overall results 370a-370d), having bit patterns 372 of "zzzz'zzzz". Depending on implementation, a value of "0" or a value of "1" in the bit pattern 372 of the overall result 370 indicates an error in the sequence. Further, in at least some implementations, and as will be further described, particular bit positions in the 8-bit result 370 can serve as flag bits, indicating a particular type of error. Thus, a given result 370 can identify that an error occurred and the nature of the error.

Figure 3C:
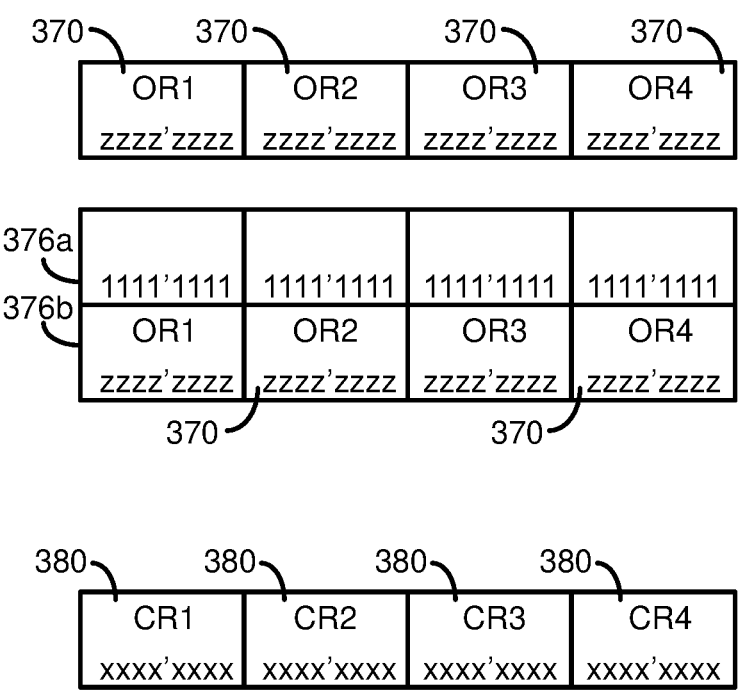
FIG. 3C illustrates how the combined result of FIG. 3B can be processed to flip/invert the bits of the combined result, such as to have a value C of 1, rather than 0, indicate a validation error.

FIG. 3C illustrates how the overall results 370 for each lane can be used in a saturated subtraction technique to convert a result from "0" indicating an error to a result where a "1" indicates an error. FIG. 3C illustrates the overall results 370, and illustrates the overall results in a register 376b, while a register 376a includes a series of byte with all bits set to "1" ("1111'1111). Contents of the register 376b are subtracted from the register 376a to provide converted results 380. It can be seen that the subtraction operation results in "flipping" the bit values in the overall results, since a starting value of 1 will provide a value of 0 (1 from the register 376a minus a 1 from the register 376b), and a starting value of 0 will provide a value of 0 (1 from the register 376a minus 0 from the register 376b).

Figure 3D:
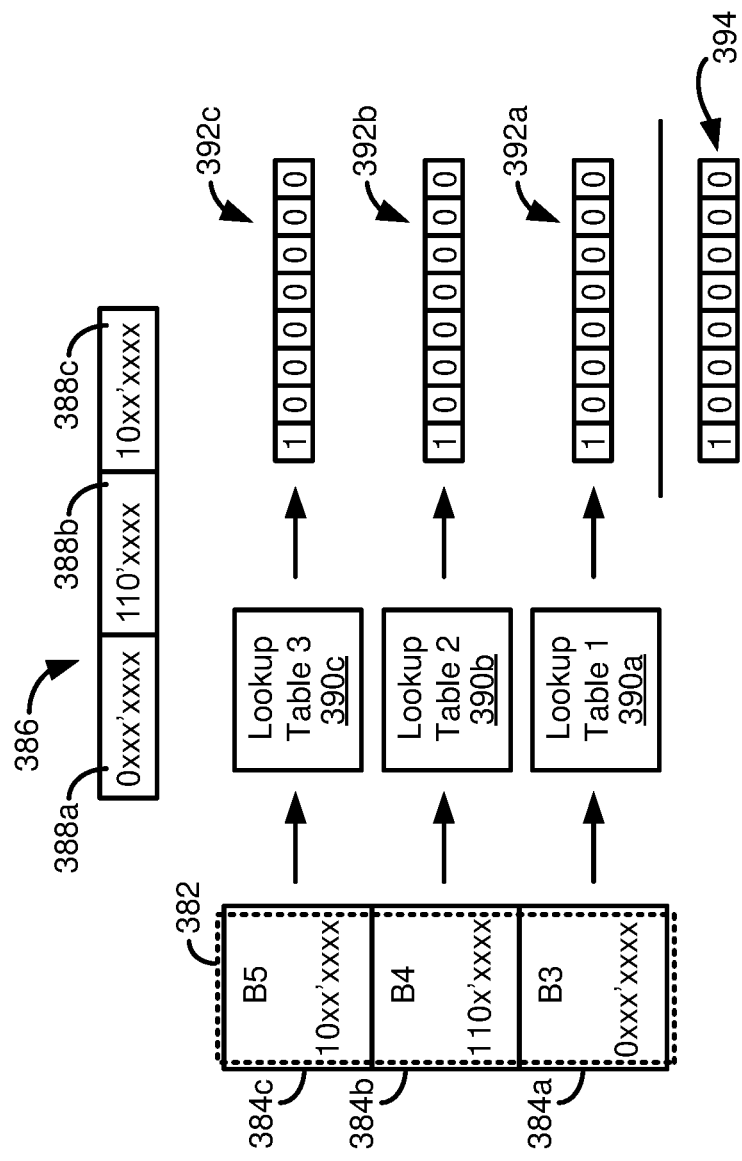
FIG. 3D illustrates how the technique of FIGS. 3A-3C can be applied to a properly encoded CESU-8 three-byte sequence.

FIG. 3D provides further details regarding how lookup tables can be used to identify whether a particular byte sequence (including particular bytes thereof) is validly encoded. FIG. 3D illustrates a single lane 382 of three SIMD registers 384 (shown as registers 384a, 384b, 384c) holding values for a valid three-byte CESU-8 encoded sequence 386. As discussed with respect to FIG. 1, individual bytes in CESU-8 encoded characters include header bits indicating the nature of a given byte. In this case, the leading byte 388a has "0" for its header bit, indicating that it is a one-byte code point (corresponding to an ASCII character), and the remaining two bytes, 338b, 388c are used for a two-byte code point, where the second byte includes header bits "110," indicating the start of a two-byte code point, and where the third byte includes header bits "10," indicating a continuation byte.

Lookup tables 390a, 390b, 390c are generated for respectively, the first byte in a three-byte sequence, the second byte in a three-byte sequence, and the third byte in a third byte sequence. Bytes representations 392a, 392b, 392c hold the results of table lookups using the generated tables 390a, 390b, 390c. In each case, the most significant bit is set, indicating that the bytes and sequence are properly encoded. Note that the lookup tables 390a, 390b, 390c only need to use the four most significant bits of each register 384 as input, since the technique does not "care" about the contents/payload of a particular byte or byte sequence, only whether the three-byte sequence is valid under the encoding scheme. A final result 394 has the most significant bit set, indicating a valid sequence.

Figure 5A:
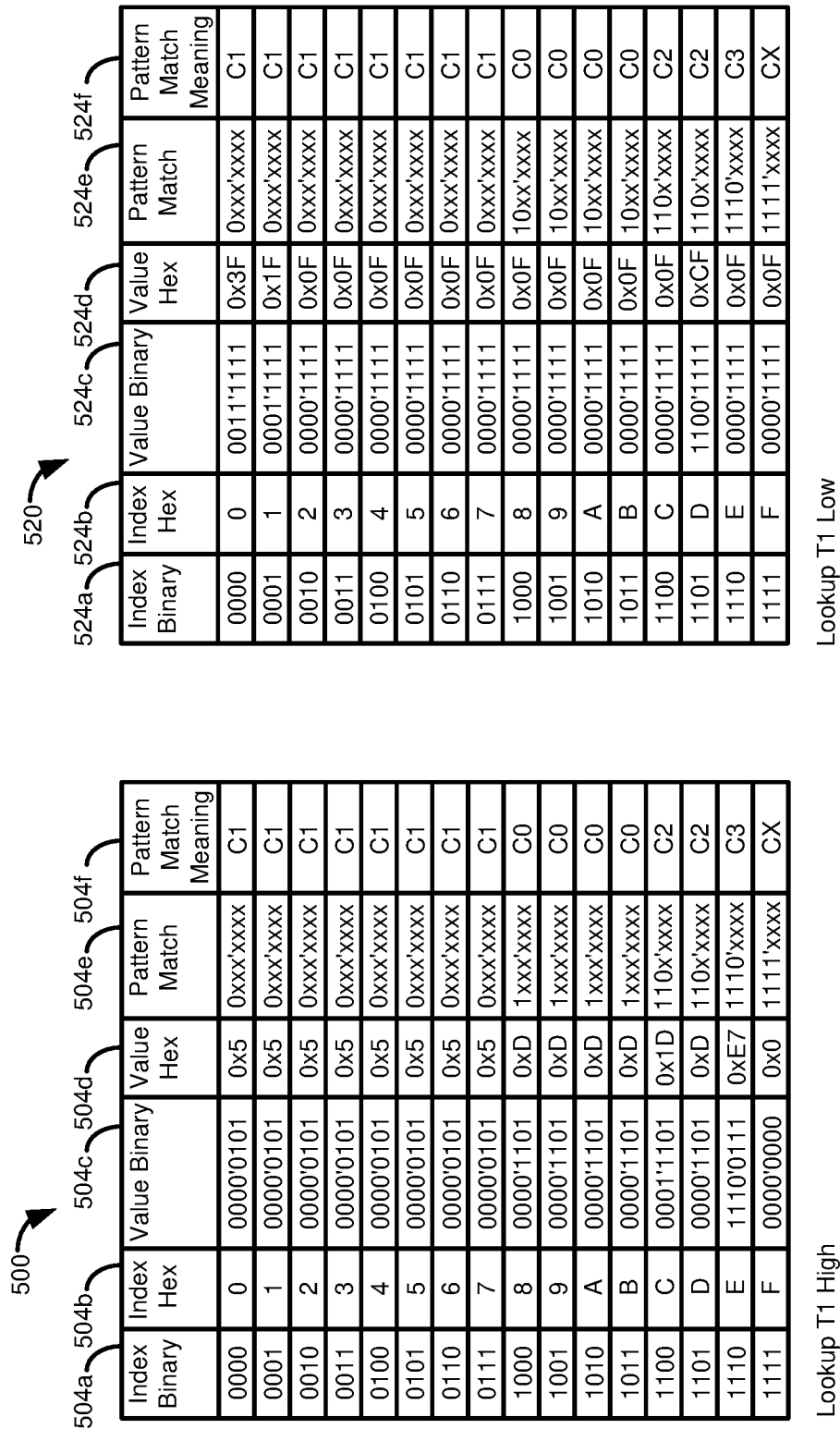

Example 4—Example Validation of Encoded Data, Including Flag Bits Identifying Specific Validation Errors FIGS. 4, 5A, and 5B illustrate a process for validating CESU-8 encoded characters in a somewhat different way than that described with respect to FIGS. 2 and 3A-3D. That is, in this scenario, the lookup tables are implemented so as to provide results where a value of "1" indicates a validation error. As with the technique described with respect to FIGS. 3A-3D, the results from individual lookup tables are combined (such as by a bitwise AND operation), and a value of "1" in the combined result indicates a validation error. The result bits serve as bit flags for particular error conditions, and so an overall result indicates whether a validation error is present and the nature of the validation error.

FIG. 4 includes a table 400 identifying invalid bit patterns, while table 450 illustrates how the invalid bit patterns can be combined such that individual bits in a byte can be used to represent different error conditions. Lookup tables can be defined to produce the invalid bit patterns based on provided index values for an invalid byte sequence.

Turning first to table 400, rows 404a-404i indicate particular patterns that are associated with the error condition of being too short. Column 408a of the table provides an identifier for a particular pattern of byte headers, column 408b provides the code point types associated with the bytes in the byte pattern (using the notation of table 100 of FIG. 1), and column 408c lists the byte pattern using the actual bit sequences for each byte. As discussed in Example 3, for purposes of disclosed validation processes, only the header bits indicating a particular byte type are needed for the lookup table, since the validation process looks for invalid byte sequences, rather than evaluating an actual character that is encoded by any particular byte sequence.

A brief explanation of the "too short" error conditions is provided. For row 404a, the first byte, annotated C2, indicates the first byte of a 2-byte code point, but the next byte is a one-byte code point. So, a pattern of C2-C1 in row 404a is too short, because the leading byte of the two-byte code point is not followed by a continuation byte. The analysis is similar for rows 404b and 404c, where the C2 byte is followed by, respectively the first byte in a two-byte code point or the first byte in a three-byte code point, rather than being followed by a continuation byte, C0, needed to make this particular two-byte sequence valid under CESU-8 encoding.

Rows 404d-404f have errors similar to those described for rows 404a-404c. That is, the code point types for the sequence have a leading byte that identifies a first byte of a three-byte code point. However, instead of being followed by the first of two continuation bytes, the first byte is followed by, respectively, a one-byte code point, the leading byte of a two-byte code point, or the leading byte of a three-byte code point. Rows 404g-404i have similar issues as rows 404d-404f, except that the second byte in the sequence is a continuation byte, but the third byte, rather than being the final continuation byte, is instead, respectively, a one-byte code point, the first byte of a two-byte code point, or the first byte of a three-byte code point.

Rows 404j-404l are associated with byte patterns that are too long. For example, the first byte of the pattern for row 404j is for a one-byte code point, but is followed by a continuation byte. A one-byte code point should not be associated with a continuation byte, and the following byte should be another one-byte code point, or the leading byte of a two-byte code point or the leading byte of a three-byte code point. Similarly, row 404k has a first byte that indicates the start of a two-byte code point, but is followed by two continuation bytes, rather than a single continuation byte. Instead, the third byte in the patterns should be a one-byte code point or the leading byte of a two or three-byte code point. Row 404l is overlong as it contains three continuation bytes where, according to CESU-8 encoding, at most two continuation bytes should occur in series, being associated with a three-byte code point or a surrogate of a surrogate pair. At the least, then, the second continuation byte of row 404l would be expected to be followed by a one-byte code point or the leading byte of a two or three-byte code point.

Rows 404m-404p are associated with byte patterns that are "overlong." That is, many encoding schemes require that a code point be encoded in the shortest possible form, such as encoding a character using one byte, if possible, rather than using two or three bytes. As an example, in UTF-8, the letter "A" can be encoded in a single byte as "01000001." However, the same value could also be expressed in two bytes as "11000010 10000001" using two-byte UTF-encoding. This two-byte representation would typically be considered invalid for an encoding scheme that requires the use of the shortest possible form/representation.

Turning to the specific examples shown, row 404m contains an overlong pattern, since the first byte indicates the beginning of a two-byte code point, but the first byte does not contain any set payload bits (that is, those bits are set to "0," rather than "1"). If all the payload bits are in the continuation byte, then it would be expected that the payload represents a one-byte code point and could have been represented in one byte. Row 404n indicates a similar issue, in that only the rightmost bit contains set payload bits, so the payload is represented using less than 8 bits, the payload is for a one-byte code point, and could have been represented using a single byte. Rows 404o and 404p are similar to rows 404m and 404n, but less than all of the payload bits of the second, continuation byte are set, indicating that the code point is a two-byte code point, and could have been encoded using two bytes instead of three. As will be further explained, disclosed techniques can be used to identify other encoding issues, such as if a trailing surrogate of a surrogate pair is not preceded by a leading surrogate, or if a leading surrogate is not followed by a trailing surrogate.

Table 450 illustrates how different bits of a result byte can used to identify the occurrence of a validation error, but can also serve as flag bits to identify the specific type of validation error. In particular, column 454a of table 450 identifies particular bit positions, while columns 454b-454e indicate results of particular lookup tables that will produce the identified error, column 454f provides the result of combining the different possibilities reflected in columns 454b-454e, and column 454g provides a description of the error condition or validation analysis.

Taking the individual rows 458a-458h, the column values for row 458a correspond to the byte sequences of rows 404a-404f. That is, regardless of the nature of the leading byte in a three-byte sequence, if the second byte has header bits indicating the start of a two or three-byte code point, the sequence is too short if the third byte in the sequence is not a continuation byte. Row 458b corresponds to the byte sequences of rows 404g and 404h. In this case, an error condition exists if the leading byte in the sequence is the first byte of three-byte code point, the second byte is correctly a continuation byte, but the third byte is anything other than the expected second continuation byte.

Row 458c corresponds to row 404j, where a given sequence includes a portion that is too long. As discussed for 404j, a sequence is too long if a single-byte code point is followed by a continuation byte. At this point, it is noted that column 454b provides values of "all" for rows 458a and row 458c. Rows 458a and 458c look for errors specifically in bytes two and three of a three-byte sequence. The sequence is invalid regardless of the type of byte in the first byte of a three-byte sequence provided the conditions of the second and third bytes are satisfied. For example, a three-bytes sequence is invalid if the second and third bytes are too short, if even if the first byte was associated with a one-byte code point.

Row 458d corresponds to the byte sequences of rows 404k and 404l. For row 458d, the sequence is overlong if a continuation byte or the start of a two-part code point are followed by two continuation bytes, since, in CESU-8, at most two sequential continuation bytes are valid, generally, and only a single continuation byte is valid after a byte indicating the start of a two-byte code point.

Rows 458e and 458f correspond to validation checks discussed above that do not involve improper code sequences. That is, the rows 458e and 458f identify situations where a character is encoded using more bytes than needed. Row 458e identifies two-byte sequences that could have been encoded using one byte, while row 458f identifies three-byte sequences that could have been encoded using two-bytes, or even one byte. Rather than using the "C" notation, the values of the columns 454b-454e use hexadecimal notation to identify a particular bit sequence associated with the relevant condition. For example, "$E_{16}$" corresponds to "1110."

Rows 458g and 458h do not identify validation errors, but are used to identify leading or trailing surrogates. As will be further explained, the presence of leading and trailing surrogates can be tracked to ensure that a leading surrogate is followed by a trailing surrogate, or that a trailing surrogate is preceded by a leading surrogate.

FIGS. 5A and 5B illustrate example lookup tables 500, 520, 540, 560 that can be used in the specific application of CESU-8 validation. Tables 500 and 520 are used, respectively, for the high and low nibbles of the first byte of a three-byte sequence, while tables 540 and 560 are used for the high nibbles of the second and third bytes of the three-byte sequence. Each of the tables 500, 520, 540, 560 has respective columns 504a, 524a, 544a, 564a and 504b, 524b, 544b, 564b that provide indexes into the table in, respectively, binary and hexadecimal notation. Columns 504c, 524c, 544c, 564c and 504d, 524d, 544d, 564d provide values returned by the table lookup for a particular index value in, respectively, binary and hexadecimal formats. Columns 504e, 524e, 544e, 564e provide the particular byte pattern that is associated with a result, while columns 504f, 524f, 544f, 564f provide the byte type for the byte pattern (that is, using the notation introduced in table 100 of FIG. 1).

In this implementation, a result of "1" indicates a particular error, and the position of "1" in the result byte indicates an error type. Generally, the values of the lookup tables 500, 520, 540, 560 are selected such that a "0" will appear in at least one lane of the SIMD registers holding the lookup results. As an example, consider the valid sequence C1-C2-C0. According to the lookup tables 500, 540, 560, the results are:

0000'0101
0001'0001
0011'1100

Since each lane contains a "0" value, the bitwise AND operation provides a result that has no flag bits set, indicating that the sequence is valid. On the other hand, consider the invalid sequence C2-C0-C0. The lookup tables results from tables 500, 540, 560 are:

0001'1101
0011'1010
0011'1100

The result of the bitwise AND operations on these results is 0001'1000. The presence of at least one "1" in the results indicates that the sequence is invalid. Looking at the positions of the set bits in the result, bits 3 and 4, as bit flags for error conditions, according to table 450 of FIG. 4, the sequence is identified as being a two or three-byte code point that is too long, using bit 3, and that it is invalid because the values are not encoded using the smallest number of bytes, using bit 4.

Figure 6A:
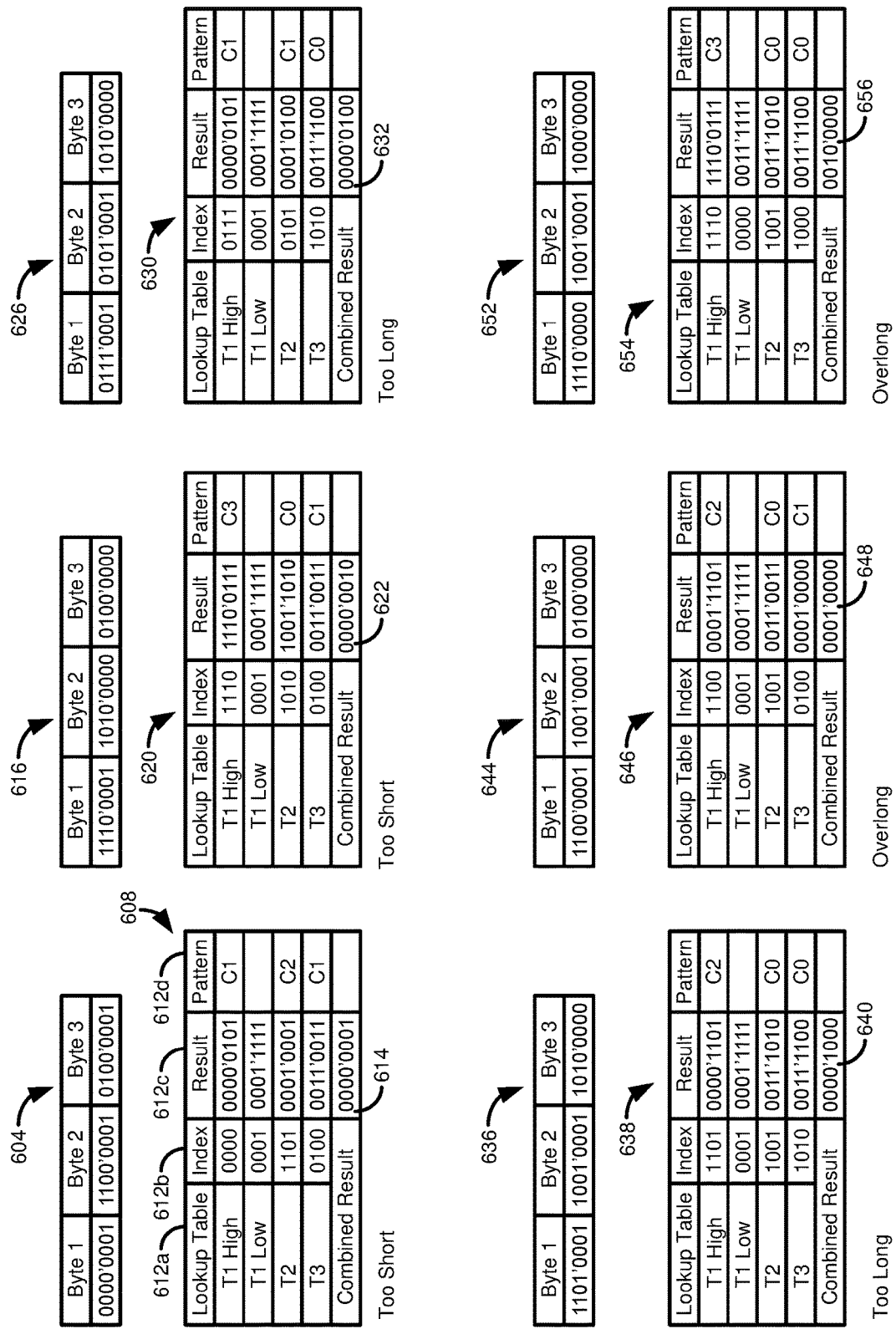
FIGS. 6A and 6B provide example CESU-8 byte sequences for each of the bit flags present in FIG. 4.
Figure 6B:
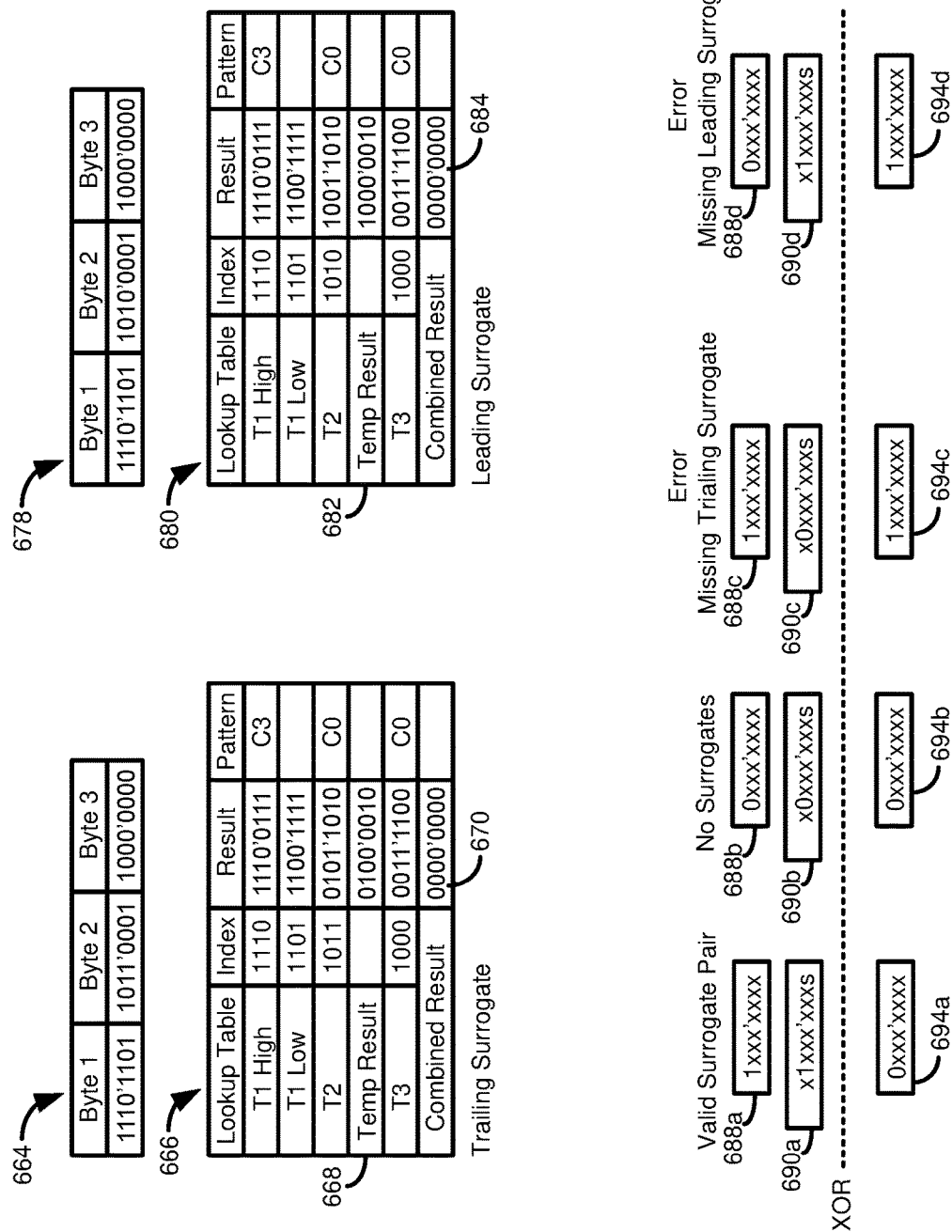

Example 5—Example Byte Sequences Corresponding to Errors Identified Using Flag Bits FIGS. 6A and 6B provide examples of each of the error/validation conditions in the table 450 of FIG. 4, with reference to the particular flag bits that indicate a particular validation issue or finding (such as whether a given sequence corresponds to a leading surrogate or a trailing surrogate of a surrogate pair in CESU-8). First, consider byte sequence 604 of FIG. 6A. From inspection of the byte sequence 604, referring to table 100 of FIG. 1, it can be observed that the corresponding pattern is C1-C2-C1. From this information, it can be seen that this is an invalid sequence that is "too short," since the first byte of a two-byte code point is not followed by a continuation byte. However, this result can quickly be determined by a computer to be invalid used disclosed techniques, including using SIMD registers, which also allows multiple sequences to be evaluated in parallel with a single instruction.

Table 608 provides information used for table lookups, as well as table lookup results, for the byte sequence 604. In FIGS. 6A and 6B, the table lookups are performed using the lookup tables 500, 520, 540, 560 of FIGS. 5A and 5B. Column 612a of the table 608 identifies the particular lookup table used, column 612b identifies the index value used (from the byte sequence 604), column 612c provides the lookup result (or, for the last row, the combined result of a bitwise AND operation on the results of the four table lookup operations), and column 612d identifies the particular byte type, using the annotation introduced in table 100 of FIG. 1, associated with the index value (high nibble) of a given byte of the byte sequence 604. From the combined result 614 of 0000'0001 it is seen that the flag bit 0 is set (has a value of "1"), which, from table 450, indicates that the sequence is a two or three-byte code point that is too short, which matches the result from manual inspection of the byte sequence 604.

Table 620 provides lookup information and results for a byte sequence 616. By inspection, it can be determined, such as using the table 100, that the sequence is C3-C0-C1, which is also too short under CESU-8 encoding, since it lacks the second continuation byte for the three-byte code point. The table 620 illustrates the indexes used, table lookup results, bitwise AND results, and byte notations in a similar manner as the table 604, and so will not be further described in detail. Looking at the result 622 of the bitwise AND operation for the lookup results, it can be seen that the first bit is set. Confirming the error determined by inspection, table 450 indicates that the first bit being set is associated with a byte sequence that is too short. Specifically, the sequence is too short because it lacks the second continuation byte for a three-byte code point.

Turning to a byte sequence 626, table lookup results, and a combined result 632, are shown in table 630. By inspection, it can be seen that the byte sequence 626 is C1-C1-C0. The byte sequence is too long, as it contains a continuation byte that is preceded by one-byte code points, which do not require a continuation byte. This is confirmed by the combined result 632, 0000'0100, there the third bit is set. According to the table 450, the third bit, used as a bit flag, is associated with a byte sequence that includes a one-byte code sequence that is too long, as improperly being followed by a continuation byte.

Turning next to the sequence 636, it can be determined by inspection that the sequence has a pattern of C2-C0-C0. The sequence 636 is too long, as it contains two continuation bytes, rather than a single continuation byte, for a two-byte code point. A combined result 640 in a table 638 of lookup information and results also identifies this validation error. That is, the combined result 640 of "0000'1000" has the fourth bit set. Using the fourth bit as a flag for a particular error condition, according to the table 450, identifies the sequence 636 as being too long for a two or three-byte code point.

By inspection, it can be determined that a sequence 644 contains a character that is encoded in an overly long manner—using more bytes than needed. The pattern of the sequence 644 can be determined by inspection to be C2-C0-C1. Note that, without looking at the contents of the bytes in the sequence 644, the sequence is valid, in the sense of not being too long or too short, since the initial byte for the first byte of a two-byte code sequence is followed by a single continuation byte, and where the third byte encodes a one-byte code point. However, the first byte of the two-byte code point does not include a set payload bit until bit 0. Since the payload is only 7 bits, the payload is for a one-byte code point, and could be more efficiently encoded in single byte.

A combined result 648 of a table 646 that includes lookup information and results for the sequence 644 also identifies this error. The combined result 648 is 0001'0000. The fifth bit serves as the error flag and, according to the table 450, is associated with an overlong two-byte code point, consistent with the inspection result.

A sequence 652 is associated with a table 654 that provides lookup information and results, as well as a combined result 656. By inspection, it can be seen that the sequence 652 is of the type C3-C0-C0. As with the sequence 644, the sequence is not too long or too short, given that the first byte is the first byte in a three-byte code point and the following two bytes are continuation bytes. The first set payload bit of the sequence 652 occurs at bit 4 of the first continuation byte. Thus, the payload is formed from five bits of the second continuation byte and six bits of the third continuation byte, for a total of eleven bits of payload information. However, a two-byte code point is capable of storing eleven bits. So, the payload is a two-byte code point, but is represented in a less efficient form as a three-byte code point.

The combined result 656 also identifies this error. In the combined result 656, the fifth bit is set. According to the table 450, the fifth bit, used as a flag bit, indicates an overlong three-byte code point, which matches the conclusion from inspection.

FIG. 6B illustrates examples of the conditions identified by the sixth and seventh flag bits of a combined result. These conditions correspond to identifying a particular byte sequence as a leading surrogate of a surrogate pair or as a trailing surrogate of a surrogate pair. While by themselves not serving as encoding errors, the information used from these flag bits can be used to identify errors, such as a leading surrogate that is not followed by a trailing surrogate, or a trailing surrogate that is not preceded by a leading surrogate.

Turning first to a sequence 664, it can be seen by inspection that the sequence is for a trailing surrogate, since the first byte is the leading byte of a surrogate, the second byte indicates the second byte of a trailing surrogate, and the third byte is a continuation byte-thus having the pattern ED-B-C0. Table 666 provides lookup information and results, as well as a "temporary" result 668 and a combined result 670. The combined result 670 has no set error bits, indicating that the sequence is valid. This is consistent with initial inspection, where the byte sequence 664 is in the proper format for a trailing surrogate.

The temporary result 668 can be used to identify the byte sequence 664 as for a trailing surrogate. In the temporary result 668, the sixth bit is set, which, from the table 450, indicates that the sequence is associated with a trailing surrogate.

Finally, a byte sequence 678 can be identified as being for a leading surrogate, since it is of the type ED-A-C0. Turning to a table 680 having lookup information and results for the byte sequence, like the table 666, the table 680 provides a temporary result 682 and a combined result 684. The combined result 684 does not have any set flag bits, indicating that no validation error was identified, which is consistent with the result from inspection. In the temporary result 682, the seventh flag bit is set, which, according to the table 450, identifies the sequence as a leading surrogate, where the combined result 684 indicates that the leading surrogate is correctly formed.

Note that the temporary results 668, 682, at least in some implementations, are only used to identify whether a particular sequence is a leading or trailing surrogates, where the combined results 670, 684 are used to identify validation errors. Depending on implementation, a temporary result can be generated for all byte sequences, whereas in other implementations a temporary result is only generated, or only analyzed, if the first byte of a given sequence corresponds to the first byte of a surrogate.

FIG. 6B also illustrates a technique for determining whether an input sequence includes valid surrogate pairs using lookup results from the table 560 of FIG. 5B. In particular, lookup results 688 (shown as results 688a-668d) for a first three-byte sequence can be compared with lookup results 690 (shown as results 690a-690) for an immediately subsequent (or in some cases, immediately preceding) three-byte sequence. From the table 450 of FIG. 4, it can be seen that bit 7 being set for result indicates that a sequence corresponds to a leading surrogate, while bit 6 being set for a result indicates that a sequence corresponds to a trailing surrogate. In a disclosed technique, the bits of one of the results 688, 690 can be shifted such that bit 7 and bit 6 of the results 688, 690 are aligned, such as in aligned lanes of SIMD registers. In FIG. 6B, the results 690 are shown as shifted to the left by one bit. An XOR operation can be performed between each set of results 688, 690 to provide a final result 694 (shown as final results 694a-694d).

Result 694a, obtained from lookup results 688a, 690a corresponds to a situation where a leading surrogate is immediately followed by a trailing surrogate. The XOR result of 1 and 1 is zero, where a zero result in this implementation indicates that no error is present. The result 694b, obtained from lookup results 688b, 690b corresponds to neither three-byte sequence being associated with a surrogate. Thus, the relevant bit values are 0 and 0, and the XOR result is 0, indicating no validation error. Results 692c and 692d correspond to scenarios where, respectively, there is a missing trailing surrogate or a missing leading surrogate. In each case, the lookup results 688c, 690c and 688d, 690d include both a 0 and 1, where the XOR result is 1, as indicated in the results 692c, 692d. Since the results 692c, 692d include a value of 1, a validation error is identified.

Example 6—Example Validation of Surrogate Pairs

Figure 7:
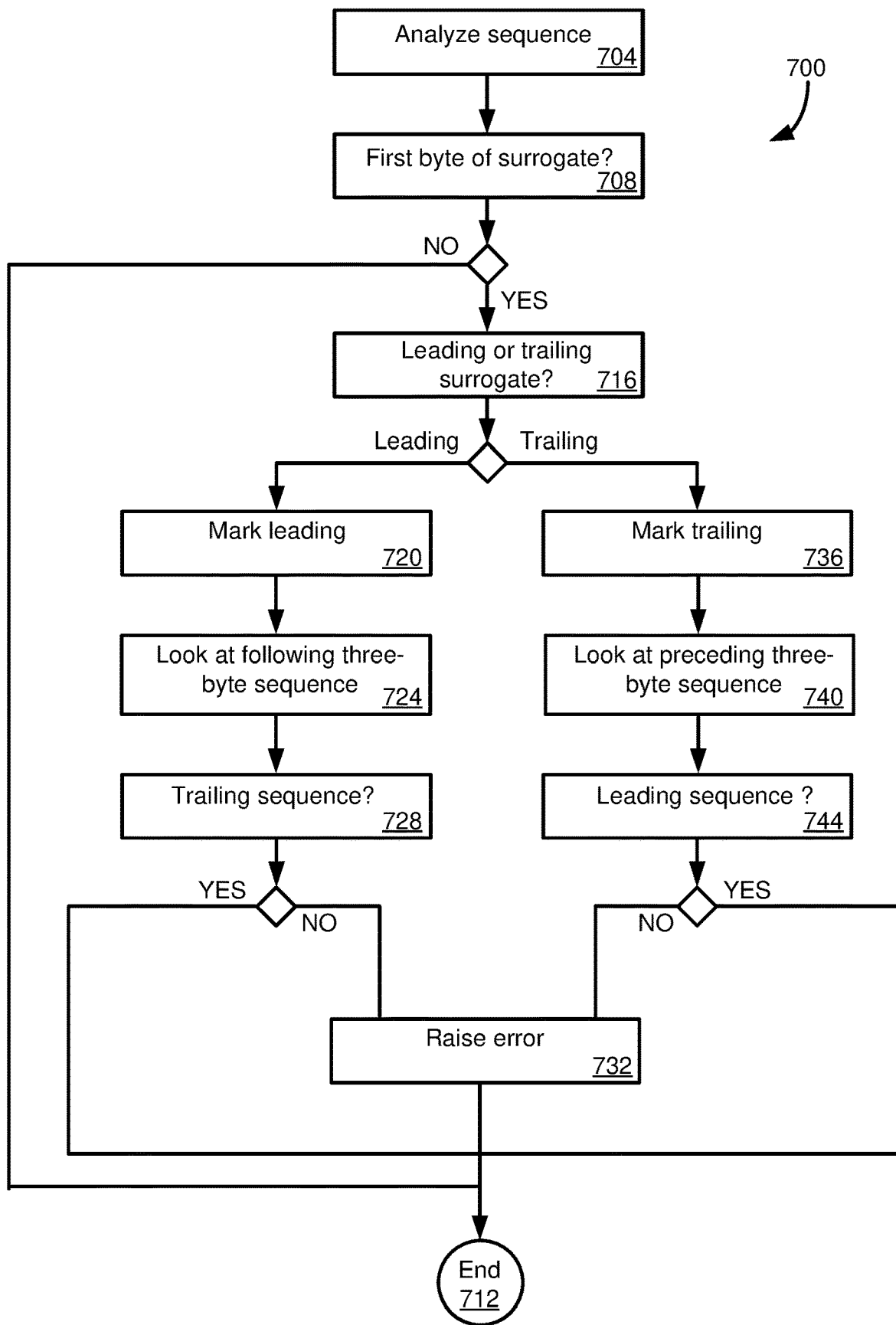
FIG. 7 is a flowchart of a process of determining whether a leading or trailing surrogate of CESU-8 data set is part of a properly encoded surrogate pair.

FIG. 7 is a flowchart of a process 700 of analyzing an input byte sequence to determine whether surrogate pairs occur correctly in the input byte sequence. That is, the process 700 determines whether a leading surrogate is associated with a trailing surrogate, or whether a trailing surrogate is associated with a leading surrogate. The process 700 includes analyzing for both of these issues in a single process.

An input sequence is analyzed at 704. In the specific example of CESU-8 encoding, the input sequence can be a three-byte sequence. It is determined at 708 whether the first byte of the sequence corresponds to the leading byte of a leading or trailing surrogate. If not, the process 700 can end at 712. Although the process 700 is stated to end at 712, in practice, this can refer to a particular iteration of analyzing the input sequence, and the process 700 can be performed provided that byte sequences remain to be analyzed in an overall input stream.

If it is determined at 708 that the first byte of the sequence corresponds to the leading byte of a surrogate, it is determined at 716 whether the surrogate is a leading or trailing surrogate. Determining whether the surrogate is a leading or trailing surrogate can include determining whether the second byte of a three-byte sequence for a surrogate contains header bits indicating a leading surrogate or header bits indicating a trailing surrogate. This determination can be made using lookup tables, as described in Example 5.

If the surrogate is determined at 716 to be a leading surrogate, the sequence can be marked as such at 720. Marking the sequence at 720 can include specifying the bytes in the input sequence that correspond to the sequence, or tracking the first or last byte of the three-byte sequence for the leading surrogate. At 724, the three-byte sequence following the current three-byte sequence is analyzed to determine at 728 whether it is a trailing surrogate. If not, an error can be raised at 732 that indicates that the leading surrogate is not part of a valid surrogate pair. After 732, or if it is determined at 728 that the following three-byte sequence is for a trailing surrogate, the process can end at 712. Note that looking for a trailing surrogate at 724 can be part of another iteration of the process 700.

If the surrogate is determined at 716 to be a trailing surrogate, the sequence can be marked as such at 736. At 740, the preceding three-byte sequence is analyzed, and it is determined at 744 whether the preceding three-byte sequence was associated with a leading surrogate. 744 can include looking for the marking made at 720. If a leading surrogate is identified at 744, the process can end at 712. Otherwise, an error can be raised at 732 that a leading surrogate was not identified for a trailing surrogate, and then the process can end at 712.

Example 7—Example Validation Using Table Lookups

Figure 8:
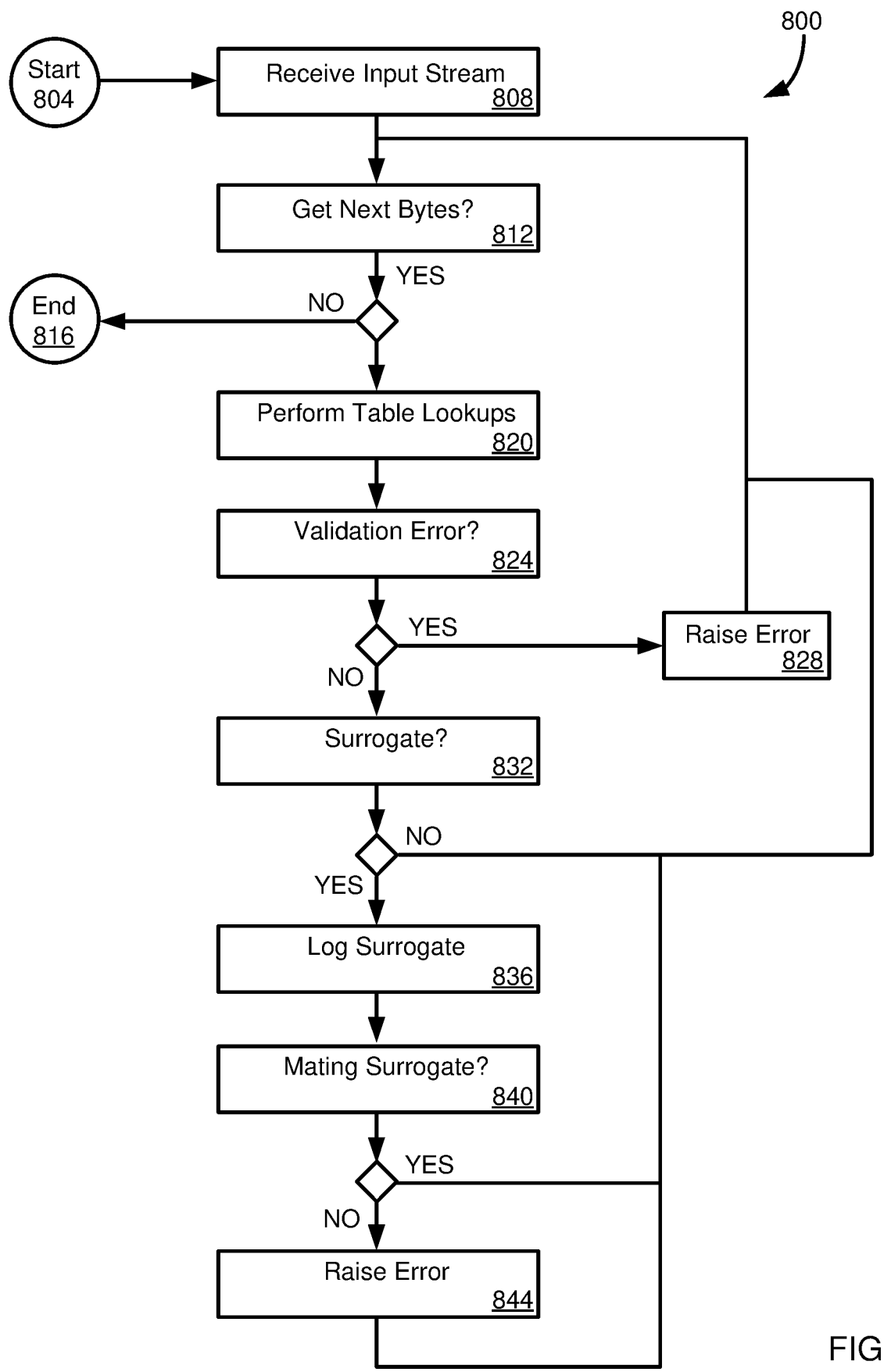
FIG. 8 is a flowchart of a process for analyzing an input stream to determine whether a set of bytes is validly encoded and, in the case of CESU-8 encoded data, whether a surrogate is part of a properly encoded surrogate pair.

FIG. 8 is a flowchart of a process 800 that can be used to check encoding validity. In particular, the process 800 can be used to validate CESU-8 data streams, but disclosed techniques can be adapted for other encoding schemes.

The process 800 begins at 804. An input stream is received at 808 that is encoded in a particular format. At 812, it is determined whether the input stream has additional bytes to be processed. If no more bytes remain to be processed, the process can end at 816. If bytes remained to be processed, table lookups can be performed at 820. Table lookups can be performed as described in Examples 3-5.

Table lookups can be performed to obtain various types of information. For example, table lookups can be performed to simply determine whether a particular byte sequence complies with an encoding format. Or, table lookups can be performed to determine whether a particular byte sequence complies with an encoding format, and, if not, a reason or condition for non-compliance.

Tables used for table lookups can be appropriately defined for a given scenario. Similarly, tables used for table lookups can be defined based on particular types of validation issues that might arise. Taking CESU-8 as an example, lookup tables can be defined to determine whether a sequence is valid or not. Alternatively, lookup tables can be defined to determine whether a sequence is valid and the reasons for any invalidity. Validity can be limited to conditions such as a sequence being too long or too short. Or, tables can be defined to identify other conditions, such as whether particular encodings are overlong (such as a character being encoded using a number of bytes larger than required for the code point). Tables can be defined to look for issues beyond whether a single byte sequence complies with encoding rules, such as whether CESU-8 surrogate pairs are consecutively defined in the input stream.

At 824, it is determined whether the table lookups identified a validation error. Determining whether a validation error exists can include looking at a combination result, such as described with respect to Examples 3-5, where, depending on implementation, a value of 0 or a value of 1 can identify an error. Similarly, depending on information, a combination result can optionally identify an error type. If an error exists, an error can be raised at 828. In some cases, raising a validation error can cause the validation process 800 to terminate. In other cases, a validation error can be raised, such as in a log, and the validation process 800 can continue, as shown in FIG. 8, where the process returns to 812 where it is determined whether additional bytes remain to be processed.

If a validation error was not determined at 824, optionally, at 832, it can be determined whether the byte sequence being analyzed is a surrogate of a surrogate pair. If so, the surrogate can be logged at 836 and it can be determined at 840 whether a mating surrogate exists. If a mating surrogate does not exist, an error can be raised at 844. 832, 836, and 840, and 844 can be implemented as described for the process 700 of FIG. 7. If is determined at 832 that the sequence is not for a surrogate, if a mating surrogate is identified at 840, or after raising an error at 844, the process 800 can return to 812.

Example 8—Example Character Counting in Variable-Length Encoded Data

The present disclosure provides an efficient technique for determining a number of characters in an input stream that is encoded in a variable-length format. That is, certain encoding schemes, including CESU-8, use different number of bytes to encode different characters. As described in Example 1, CESU-8 can have one, two, and three-byte code points, in addition to a set of two three-byte sequences that are used to encode a six-byte point surrogate pair code point. The use of varying numbers of bytes for different characters can result in the number of characters being difficult to determine, such as compared with an encoding scheme like ASCII, where every character is encoded using a single byte, and thus the number of bytes in an input stream is equal to the number of characters in the input stream.

Disclosed techniques can determine a number of characters in an input stream by analyzing bytes in an input stream/dataset. Every byte is read to determine whether the byte is a continuation byte. In some cases, this determination can be made using a lookup table approach that can be similar to the lookup tables described for processes of determining validation errors. Similarly, analyzing bytes, including through the use of lookup tables, can be performed using SIMD registers, such that multiple byte sequences can be analyzed in parallel, in a single operation.

Disclosed character counting techniques can be used alone, or with other processes, such as a process to determine whether an input stream is validly encoded. In a specific example, the disclosed character counting technique can be used with disclosed validation techniques. In the case of CESU-8 validation, a particular byte, such as the third byte in a three-byte sequence, can be analyzed for the presence of continuation bytes in a character counting process.

In the case of CESU-8, the number of continuation bytes can be subtracted from the number of bytes in the input stream to determine a number of characters in the input stream. As a simple example, a three-byte code point includes two continuation bytes. Subtracting the two continuation bytes from the three bytes in the code point provides a value of one—the three-byte sequence encodes a single character.

FIG. 9 illustrates an example character counting process 900 according to the present disclosure. FIG. 9 includes a register 904, such as a SIMD register, that includes results for a table lookup operation. In this particular implementation, the register 904 can represent the third register used for CESU-8 validation (corresponding to the third byte in a three-byte sequence), such as using a lookup table 912 that is similar to the lookup table 560 of FIG. 3. However, the result column 914*a* has the most significant bit set to 1 for rows 916 that indicate that a given byte is a continuation byte, compared with the corresponding rows of the table 560, where the most significant bit is set to 0. Setting the bits to 1 is used to indicate in a lookup result that a given byte corresponds to a continuation byte.

The most significant bits 920 are identified in the individual register elements 904*a*-904*e* of the register 904. At 924, the most significant bits are extracted, such as being placed into a 32-bit integer 928. In some systems, a SIMD instruction is available to perform this extraction operation. From the 32-bit integer, a number of set bits (having a value of 1) can be determined at 932 using an appropriate function, such as a popcount function. In at least some systems, a compiler intrinsic function is provided for this functionality. As indicated at 936, the number of set bits is equal to the number of continuation bytes. Thus, at 940, the number of characters can be determined by subtracting the number of continuation bytes from the number of bytes in an overall input stream.

Example 9—Example Pseudocode

FIG. 10 provides example pseudocode 1000 for implementing a validation process, which can be analogous to the process 800 of FIG. 8.

Example 10—Example Operations

Figure 11A:
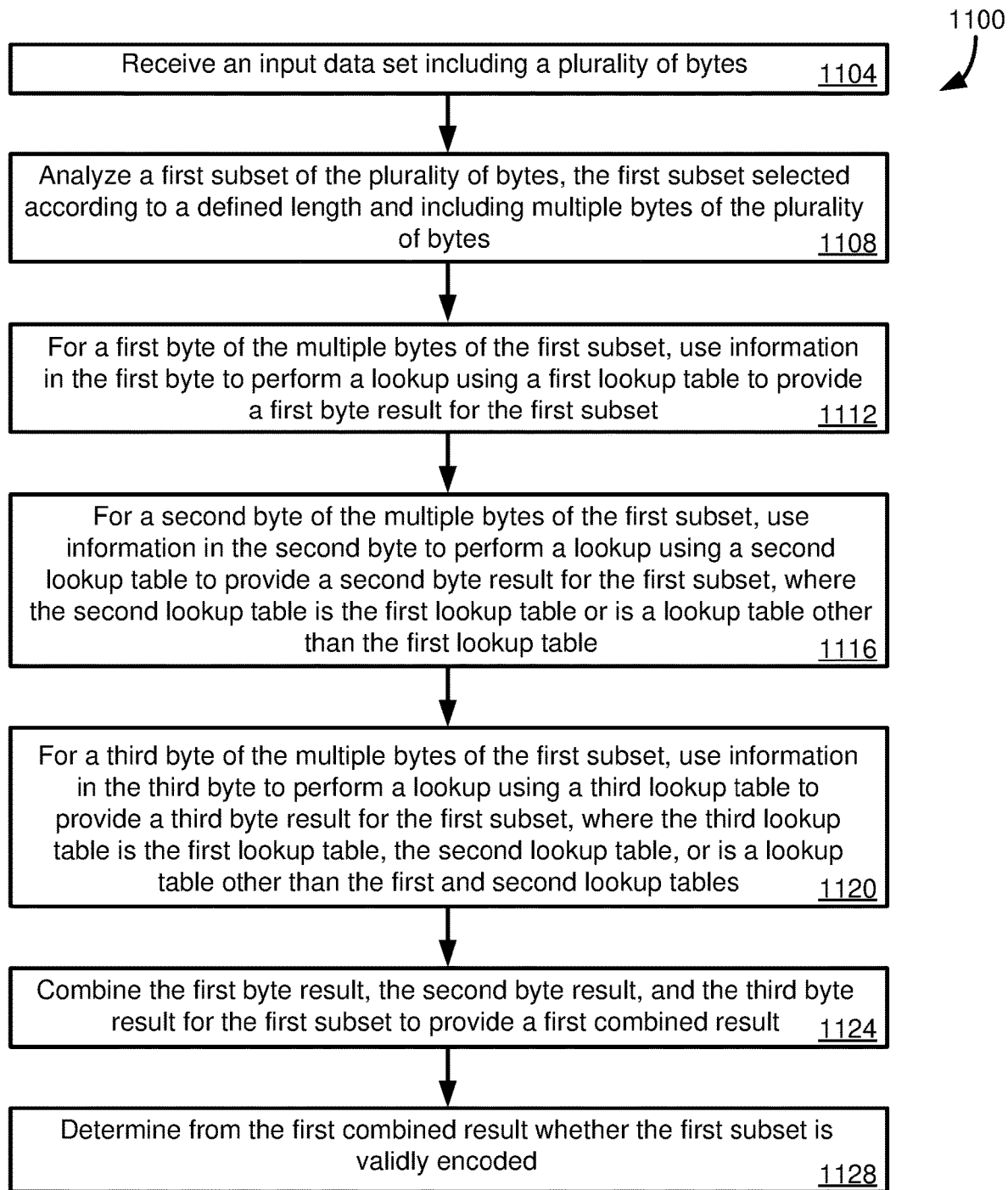
FIG. 11A is a flowchart of a process of determining whether encoded data is valid.

FIG. 11A provides a flowchart of a process 1100 of validating encoded data. At 1104, an input data set including a plurality of bytes is received. At 1108, a first subset of the plurality of bytes is analyzed. The first subset is selected according to a defined length and includes multiple bytes of the plurality of bytes. At 1112, for a first byte of the multiple bytes of the first subset, information in the first byte is used to perform a lookup using a first lookup table to provide a first byte result for the first subset. For a second byte of the multiple bytes of the first subset, at 1116, information in the second byte is used to perform a lookup using a second lookup table to provide a second byte result for the first subset. The second lookup table can be the first lookup table or can be another lookup table. At 1120, for a third byte of the multiple bytes of the first subset, information in the third byte is used to perform a lookup using a third lookup table to provide a third byte result for the first subset. The third lookup table can be the first lookup table or the second lookup table, or can be another lookup table. The first byte result, the second byte result, and the third byte result for the first subset are combined to provide a first combined result at 1124. At 1128, it is determined from the first combined result whether the first subset is validly encoded.

Figure 11B:
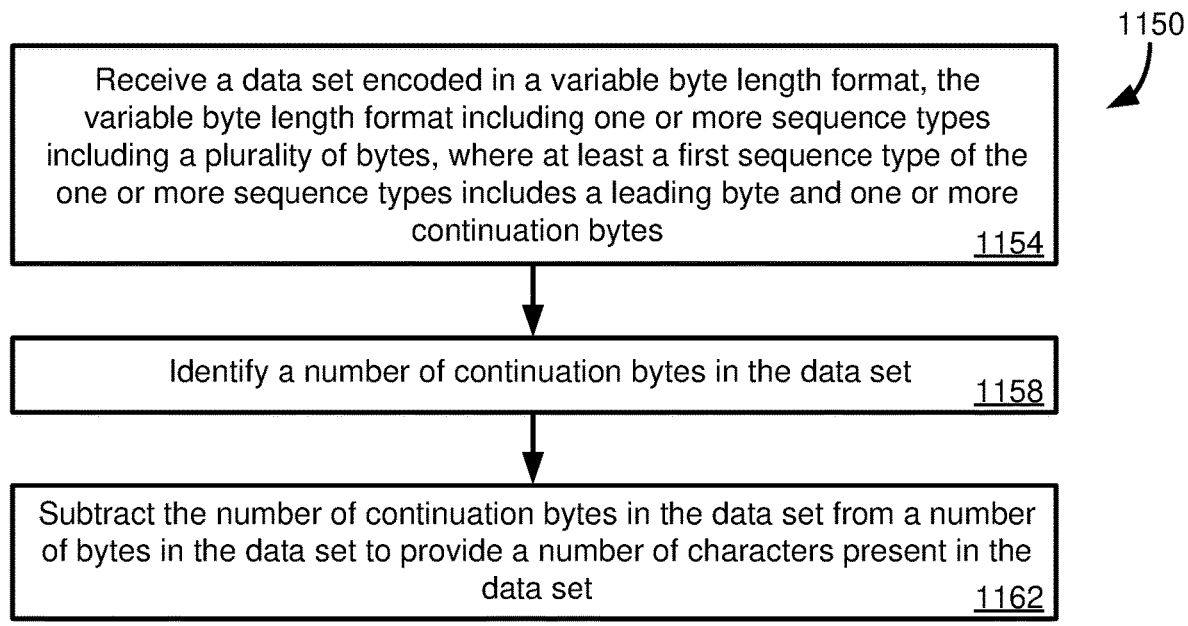
FIG. 11B is a flowchart of a process of determining a number of characters in encoded data.

FIG. 11B provides a flowchart of a process 1150 of determining a number of characters present in encoded data. At 1154, a data set is received that is encoded in a variable byte length format. The variable byte length format includes one or more sequence types including a plurality of bytes. At least a first sequence type of the one or more sequence types includes a leading byte and one or more continuation bytes. A number of continuation bytes in the data set is identified at 1158. At 1162, the number of continuation bytes in the data set is subtracted from a number of bytes in the data set to provide a number of characters present in the data set.

Example 11—Computing Systems

FIG. 12 depicts a generalized example of a suitable computing system 1200 in which the described innovations may be implemented. The computing system 1200 is not intended to suggest any limitation as to scope of use or functionality of the present disclosure, as the innovations may be implemented in diverse general-purpose or special-purpose computing systems.

With reference to FIG. 12, the computing system 1200 includes one or more processing units 1210, 1215 and memory 1220, 1225. In FIG. 12, this basic configuration 1230 is included within a dashed line. The processing units 1210, 1215 execute computer-executable instructions, such as for implementing a database environment, and associated methods, described in Examples 1-9. A processing unit can be a general-purpose central processing unit (CPU), a processor in an application-specific integrated circuit (ASIC), or any other type of processor. In a multi-processing system, multiple processing units execute computer-executable instructions to increase processing power. For example, FIG. 12 shows a central processing unit 1210 as well as a graphics processing unit or co-processing unit 1215. The tangible memory 1220, 1225 may be volatile memory (e.g., registers, cache, RAM), non-volatile memory (e.g., ROM, EEPROM, flash memory, etc.), or some combination of the two, accessible by the processing unit(s) 1210, 1215. The memory 1220, 1225 stores software 1280 implementing one or more innovations described herein, in the form of computer-executable instructions suitable for execution by the processing unit(s) 1210, 1215.

A computing system 1200 may have additional features. For example, the computing system 1200 includes storage 1240, one or more input devices 1250, one or more output devices 1260, and one or more communication connections 1270. An interconnection mechanism (not shown) such as a bus, controller, or network interconnects the components of the computing system 1200. Typically, operating system software (not shown) provides an operating environment for other software executing in the computing system 1200, and coordinates activities of the components of the computing system 1200.

The tangible storage 1240 may be removable or non-removable, and includes magnetic disks, magnetic tapes or cassettes, CD-ROMs, DVDs, or any other medium which can be used to store information in a non-transitory way, and which can be accessed within the computing system 1200. The storage 1240 stores instructions for the software 1280 implementing one or more innovations described herein.

The input device(s) 1250 may be a touch input device such as a keyboard, mouse, pen, or trackball, a voice input device, a scanning device, or another device that provides input to the computing system 1200. The output device(s) 1260 may be a display, printer, speaker, CD-writer, or another device that provides output from the computing system 1200.

The communication connection(s) 1270 enable communication over a communication medium to another computing entity, such as another database server. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

The innovations can be described in the general context of computer-executable instructions, such as those included in program modules, being executed in a computing system on a target real or virtual processor. Generally, program modules or components include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computing system.

The terms "system" and "device" are used interchangeably herein. Unless the context clearly indicates otherwise, neither term implies any limitation on a type of computing system or computing device. In general, a computing system or computing device can be local or distributed, and can include any combination of special-purpose hardware and/or general-purpose hardware with software implementing the functionality described herein.

For the sake of presentation, the detailed description uses terms like "determine" and "use" to describe computer operations in a computing system. These terms are high-level abstractions for operations performed by a computer, and should not be confused with acts performed by a human being. The actual computer operations corresponding to these terms vary depending on implementation.

Example 12—Cloud Computing Environment

Figure 13:
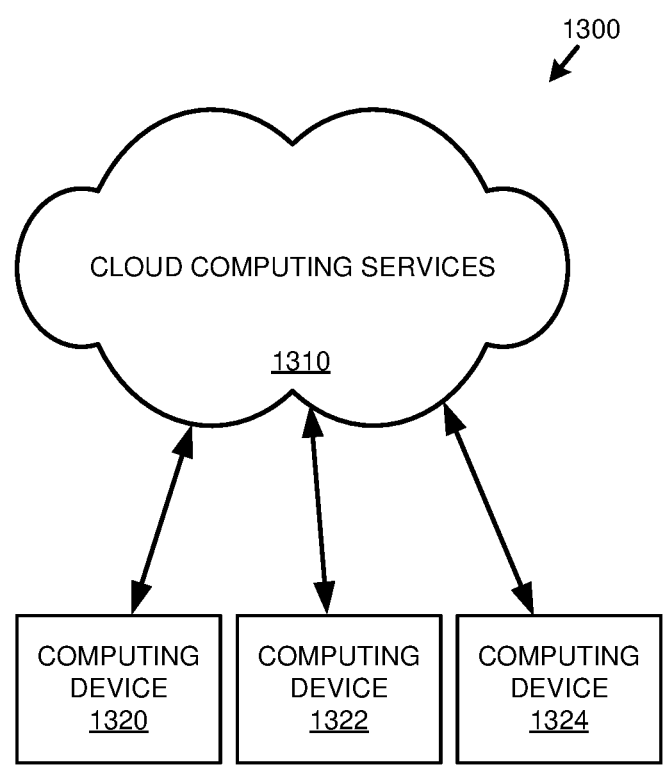
FIG. 13 is an example cloud computing environment that can be used in conjunction with the technologies described herein.

FIG. 13 depicts an example cloud computing environment 1300 in which the described technologies can be implemented. The cloud computing environment 1300 comprises cloud computing services 1310. The cloud computing services 1310 can comprise various types of cloud computing resources, such as computer servers, data storage repositories, networking resources, etc. The cloud computing services 1310 can be centrally located (e.g., provided by a data center of a business or organization) or distributed (e.g., provided by various computing resources located at different locations, such as different data centers and/or located in different cities or countries).

The cloud computing services 1310 are utilized by various types of computing devices (e.g., client computing devices), such as computing devices 1320, 1322, and 1324. For example, the computing devices (e.g., 1320, 1322, and 1324) can be computers (e.g., desktop or laptop computers), mobile devices (e.g., tablet computers or smart phones), or other types of computing devices. For example, the computing devices (e.g., 1320, 1322, and 1324) can utilize the cloud computing services 1310 to perform computing operators (e.g., data processing, data storage, and the like).

Example 13—Implementations

Although the operations of some of the disclosed methods are described in a particular, sequential order for convenient presentation, it should be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions or a computer program product stored on one or more computer-readable storage media, such as tangible, non-transitory computer-readable storage media, and executed on a computing device (e.g., any available computing device, including smart phones or other mobile devices that include computing hardware). Tangible computer-readable storage media are any available tangible media that can be accessed within a computing environment (e.g., one or more optical media discs such as DVD or CD, volatile memory components (such as DRAM or SRAM), or nonvolatile memory components (such as flash memory or hard drives)). By way of example and with reference to FIG. 12, computer-readable storage media include memory 1220 and 1225, and storage 1240. The term computer-readable storage media does not include signals and carrier waves. In addition, the term computer-readable storage media does not include communication connections (e.g., 1270).

Any of the computer-executable instructions for implementing the disclosed techniques, as well as any data created and used during implementation of the disclosed embodiments, can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in C++, Java, Perl, JavaScript, Python, Ruby, ABAP, Structured Query Language, Adobe Flash, or any other suitable programming language, or, in some examples, markup languages such as html or XML, or combinations of suitable programming languages and markup languages. Likewise, the disclosed technology is not limited to any particular computer or type of hardware. Certain details of suitable computers and hardware are well known and need not be set forth in detail in this disclosure.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and sub combinations with one another. The disclosed methods, apparatus, and systems are not limited to any specific aspect or feature or combination thereof, nor do the disclosed embodiments require that any one or more specific advantages be present, or problems be solved.

The technologies from any example can be combined with the technologies described in any one or more of the other examples. In view of the many possible embodiments to which the principles of the disclosed technology may be applied, it should be recognized that the illustrated embodiments are examples of the disclosed technology and should not be taken as a limitation on the scope of the disclosed technology. Rather, the scope of the disclosed technology includes what is covered by the scope and spirit of the following claims.

What is claimed is:

1. A computing system comprising:
   at least one memory;
   one or more hardware processor units coupled to the at least one memory; and
   one or more computer readable storage media storing computer-executable instructions that, when executed, cause the computing system to perform operations comprising:
      receiving a data set encoded in a variable byte length format, the variable byte length format comprising one or more sequence types comprising a plurality of bytes, wherein at least a first sequence type of the one or more sequence types comprises a leading byte and one or more continuation bytes;
      identifying a number of continuation bytes in the data set; and
      subtracting the number of continuation bytes in the data set from a number of bytes in the data set to provide a number of characters present in the data set.

2. The computing system of claim 1, wherein identifying a number of continuation bytes in the data set comprises:
   selecting sequential bytes of the data set at a defined interval for the data set; and
   for given bytes of the sequential bytes, using at least a portion of bits of a given byte as an index to a lookup table to provide a first result for each of the given bytes.

3. The computing system of claim 2, wherein identifying a number of continuation bytes in the data set comprises:
   extracting a bit at a selected bit position of the first result for each of the given bytes to provide a second result; and
   counting a number of set bits in the second result, wherein the number of set bits corresponds to the number of continuation bytes in the data set.

4. The computing system of 3, wherein the variable-length format is CESU-8 and wherein the defined interval is a selected byte position within three-byte sequences selected from the data set.

5. The computing system of claim 1, wherein the variable-length format comprises a header bit pattern identifying a given byte encoded in the variable-length format as a continuation byte.

6. The computing system of claim 1, wherein the variable-length format comprises a plurality of sequence types comprising a leading byte and one or more continuation bytes and identifying a number of continuation bytes in the data set comprises analyzing subsets of a defined length from the data subset for continuation bytes associated with all of the plurality of sequence types comprising a leading byte.

7. The computing system of claim 6, wherein analyzing subsets of a defined length comprises using bit values for at least one byte position in the defined length for the subsets as an index to a lookup table, wherein bit values associated with a continuation byte in any of the sequence types return an identifier of a continuation byte.

8. A method, implemented in a computing system comprising at least one hardware processor and at least one memory coupled to the at least one hardware processor, the method comprising:
   receiving a data set encoded in a variable byte length format, the variable byte length format comprising one or more sequence types comprising a plurality of bytes, wherein at least a first sequence type of the one or more sequence types comprises a leading byte and one or more continuation bytes;
   identifying a number of continuation bytes in the data set; and
   subtracting the number of continuation bytes in the data set from a number of bytes in the data set to provide a number of characters present in the data set.

9. The method of claim 8, wherein identifying a number of continuation bytes in the data set comprises:
   selecting sequential bytes of the data set at a defined interval for the data set; and
   for given bytes of the sequential bytes, using at least a portion of bits of a given byte as an index to a lookup table to provide a first result for each of the given bytes.

10. The method of claim 9, wherein identifying a number of continuation bytes in the data set comprises:
    extracting a bit at a selected bit position of the first result for each of the given bytes to provide a second result; and
    counting a number of set bits in the second result, wherein the number of set bits corresponds to the number of continuation bytes in the data set.

11. The method of 10, wherein the variable-length format is CESU-8 and wherein the defined interval is a selected byte position within three-byte sequences selected from the data set.

12. The method of claim 8, wherein the variable-length format comprises a header bit pattern identifying a given byte encoded in the variable-length format as a continuation byte.

13. The method of claim 8, wherein the variable-length format comprises a plurality of sequence types comprising a leading byte and one or more continuation bytes and identifying a number of continuation bytes in the data set comprises analyzing subsets of a defined length from the data subset for continuation bytes associated with all of the plurality of sequence types comprising a leading byte.

14. The method of claim 13, wherein analyzing subsets of a defined length comprises using bit values for at least one byte position in the defined length for the subsets as an index to a lookup table, wherein bit values associated with a continuation byte in any of the sequence types return an identifier of a continuation byte.

15. One or more non-transitory computer-readable storage media comprising:
   computer-executable instructions that, when executed by a computing system comprising at least one hardware processor and at least one memory coupled to the at least one hardware processor, cause the computing system to receive a data set encoded in a variable byte length format, the variable byte length format comprising one or more sequence types comprising a plurality of bytes, wherein at least a first sequence type of the one or more sequence types comprises a leading byte and one or more continuation bytes;
   computer-executable instructions that, when executed by the computing system, cause the computing system to identify a number of continuation bytes in the data set; and
   computer-executable instructions that, when executed by the computing system, cause the computing system to subtract the number of continuation bytes in the data set from a number of bytes in the data set to provide a number of characters present in the data set.

16. The one or more non-transitory computer-readable storage media of claim 15, wherein the computer-executable instructions that cause the computing system to identify a number of continuation bytes in the data set comprise:
   computer-executable instructions that, when executed by the computing system, cause the computing system to select sequential bytes of the data set at a defined interval for the data set; and
   computer-executable instructions that, when executed by the computing system, cause the computing system to, for given bytes of the sequential bytes, use at least a portion of bits of a given byte as an index to a lookup table to provide a first result for each of the given bytes.

17. The one or more non-transitory computer-readable storage media of claim 16, wherein the computing-executable instructions that cause the computing system to identify a number of continuation bytes in the data set comprise:
   computer-executable instructions that, when executed by the computing system, cause the computing system to extract a bit at a selected bit position of the first result for each of the given bytes to provide a second result; and
   computer-executable instructions that, when executed by the computing system, cause the computing system to count a number of set bits in the second result, wherein the number of set bits corresponds to the number of continuation bytes in the data set.

18. The one or more non-transitory computer-readable storage media of 17, wherein the variable-length format is CESU-8 and wherein the defined interval is a selected byte position within three-byte sequences selected from the data set.

19. The one or more non-transitory computer-readable storage media of claim 15, wherein the variable-length format comprises a header bit pattern identifying a given byte encoded in the variable-length format as a continuation byte.

20. The one or more non-transitory computer-readable storage media of claim 15, wherein the variable-length format comprises a plurality of sequence types comprising a leading byte and one or more continuation bytes and identifying a number of continuation bytes in the data set comprises analyzing subsets of a defined length from the data subset for continuation bytes associated with all of the plurality of sequence types comprising a leading byte.

\* \* \* \* \*